United States Patent
Lin et al.

(10) Patent No.: US 12,317,567 B2
(45) Date of Patent: May 27, 2025

(54) SEMICONDUCTOR DEVICE STRUCTURE AND METHOD FOR FORMING THE SAME

(71) Applicant: Taiwan Semiconductor Manufacturing Company, Ltd., Hsinchu (TW)

(72) Inventors: Ta-Chun Lin, Hsinchu (TW); Ming-Che Chen, Taipei (TW); Chun-Jun Lin, Hsinchu (TW); Kuo-Hua Pan, Hsinchu (TW); Jhon-Jhy Liaw, Taipei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 496 days.

(21) Appl. No.: 17/717,892

(22) Filed: Apr. 11, 2022

(65) Prior Publication Data

US 2023/0326999 A1 Oct. 12, 2023

(51) Int. Cl.
*H01L 29/66* (2006.01)
*H10D 30/01* (2025.01)
(Continued)

(52) U.S. Cl.
CPC ......... *H10D 64/021* (2025.01); *H10D 30/014* (2025.01); *H10D 30/024* (2025.01); *H10D 30/031* (2025.01); *H10D 30/43* (2025.01); *H10D 30/6211* (2025.01); *H10D 30/6713* (2025.01); *H10D 30/6735* (2025.01); *H10D 30/6757* (2025.01); *H10D 62/121* (2025.01);
(Continued)

(58) Field of Classification Search
CPC ............. H01L 29/6656; H01L 29/0673; H01L 29/0847; H01L 29/42392; H01L 29/66439; H01L 29/66545; H01L 29/66742; H01L 29/66795; H01L 29/775; H01L 29/7851; H01L 29/78618; H01L 29/78696; H01L 29/401; H01L 29/0653; H01L 29/165; H01L 29/7848; H01L 29/6653; B82Y 10/00; H10D 64/021; H10D 30/014; H10D 30/024; H10D 30/031; H10D 30/43; H10D 30/6211; H10D 30/6713; H10D 30/6735; H10D 30/6757; H10D 62/121; H10D 62/151; H10D 64/017

See application file for complete search history.

(56) References Cited

U.S. PATENT DOCUMENTS 8,772,109 B2  7/2014  Colinge
8,785,285 B2  7/2014  Tsai et al.
(Continued)

*Primary Examiner* — Jarrett J Stark
(74) *Attorney, Agent, or Firm* — Cooper Legal Group, LLC

(57) ABSTRACT

A method for forming a semiconductor device structure is provided. The method includes forming a gate stack over a substrate. The method includes forming a spacer structure over a sidewall of the gate stack. The method includes forming a source/drain structure in and over the substrate, wherein a portion of the spacer structure is between the source/drain structure and the gate stack. The method includes partially removing the outer layer, wherein a first lower portion of the outer layer remains between the source/drain structure and the gate stack. The method includes partially removing the middle layer, wherein a second lower portion of the middle layer remains between the source/drain structure and the gate stack.

20 Claims, 19 Drawing Sheets

(51) Int. Cl.
*H10D 30/43* (2025.01)
*H10D 30/62* (2025.01)
*H10D 30/67* (2025.01)
*H10D 62/10* (2025.01)
*H10D 62/13* (2025.01)
*H10D 64/01* (2025.01)

(52) U.S. Cl.
CPC ......... *H10D 62/151* (2025.01); *H10D 64/017* (2025.01)

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,209,247 B2 | 12/2015 | Colinge et al. |
| 9,236,267 B2 | 1/2016 | De et al. |
| 9,236,300 B2 | 1/2016 | Liaw |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 10,522,655 B2 * | 12/2019 | Mulfinger ........... H01L 29/6653 |
| 10,770,570 B2 * | 9/2020 | Lin ................... H01L 29/66636 |
| 11,749,755 B2 * | 9/2023 | Fung ................. H01L 29/66795 |
| | | 257/401 |
| 2014/0183663 A1 * | 7/2014 | Song ................... H01L 29/7834 |
| | | 438/300 |
| 2014/0369115 A1 * | 12/2014 | Kim ..................... H01L 29/518 |
| | | 365/182 |
| 2017/0358577 A1 * | 12/2017 | Lin ................. H01L 21/823814 |
| 2018/0047632 A1 * | 2/2018 | Zhang ............. H01L 21/823431 |
| 2018/0315764 A1 * | 11/2018 | Yang ...................... H10B 41/30 |
| 2019/0051565 A1 * | 2/2019 | Baars ............. H01L 21/823814 |
| 2019/0067458 A1 * | 2/2019 | Lin ................... H01L 29/66545 |
| 2020/0144365 A1 * | 5/2020 | Mulfinger ........... H01L 29/0847 |
| 2022/0293784 A1 * | 9/2022 | Fung ................. H01L 29/41791 |
| 2023/0345717 A1 * | 10/2023 | Shih ....................... H01L 29/788 |
| 2024/0136419 A1 * | 4/2024 | Maeda ............. H01L 29/42324 |

* cited by examiner

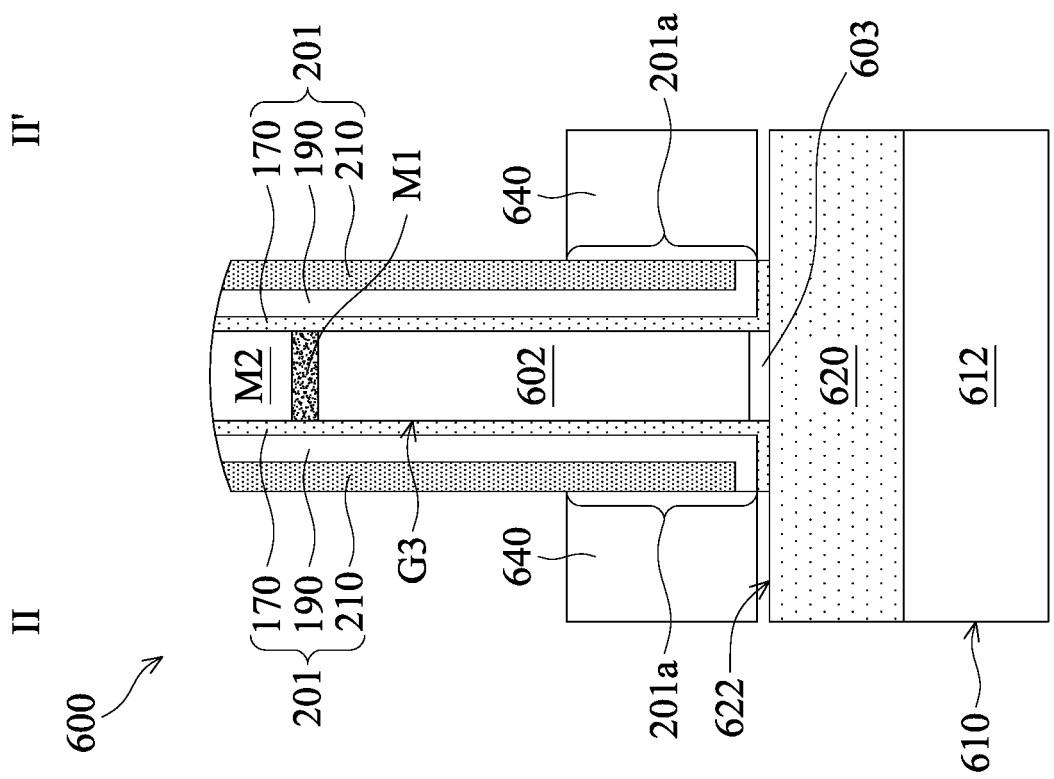
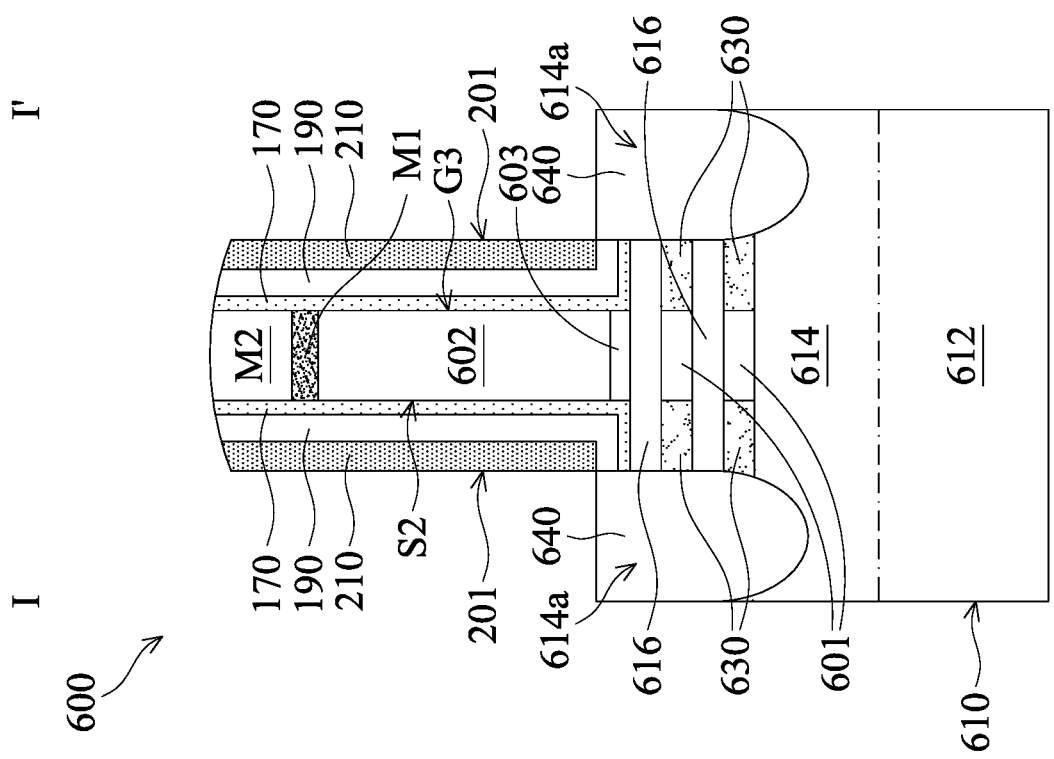
FIG. 7A-1
FIG. 7A-2

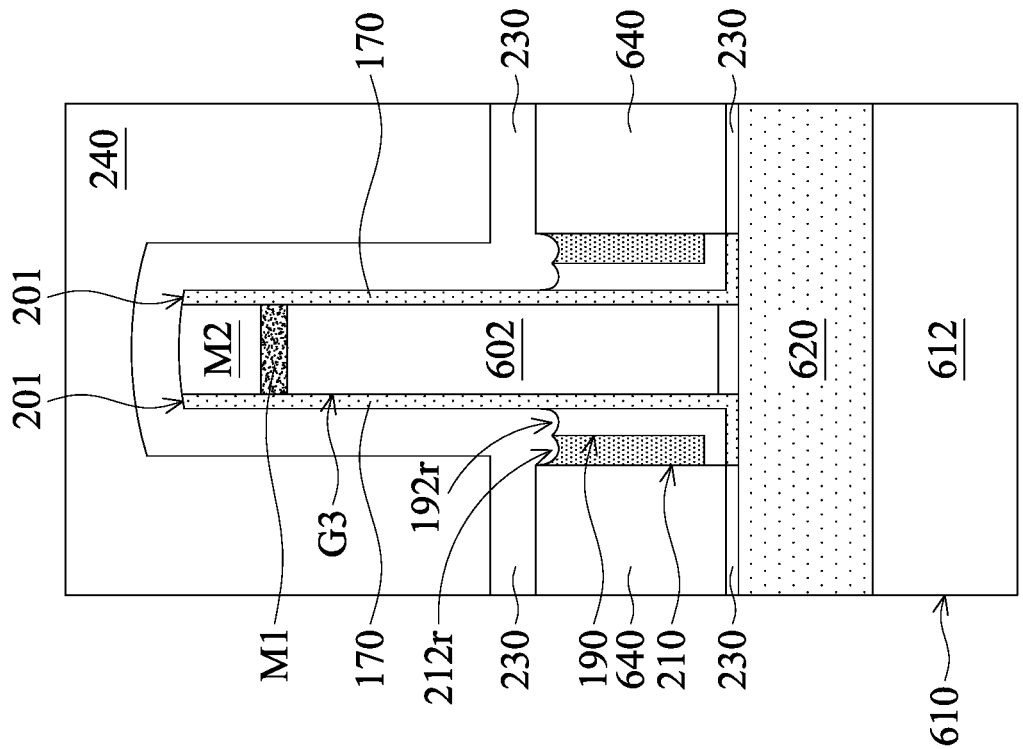
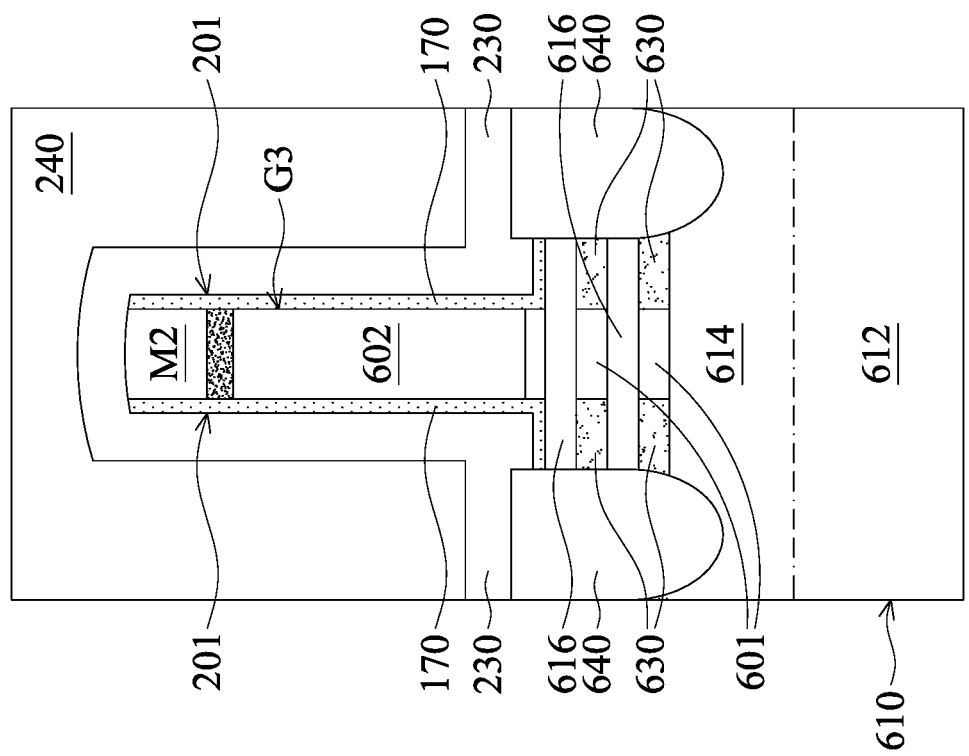
FIG. 7D-2
FIG. 7D-1

SEMICONDUCTOR DEVICE STRUCTURE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes. It is also a challenge to improve the performance of semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 4A-1 to 4H-1 are cross-sectional views of various stages of a process for forming a semiconductor device structure, in accordance with some embodiments.

FIGS. 4A-2 to 4H-2 are cross-sectional views of various stages of a process for forming a semiconductor device structure, in accordance with some embodiments.

FIGS. 7A-1 to 7E-1 are cross-sectional views of various stages of a process for forming a semiconductor device structure, in accordance with some embodiments.

FIGS. 7A-2 to 7E-2 are cross-sectional views of various stages of a process for forming a semiconductor device structure, in accordance with some embodiments.

DETAILED DESCRIPTION

Figure 2A:
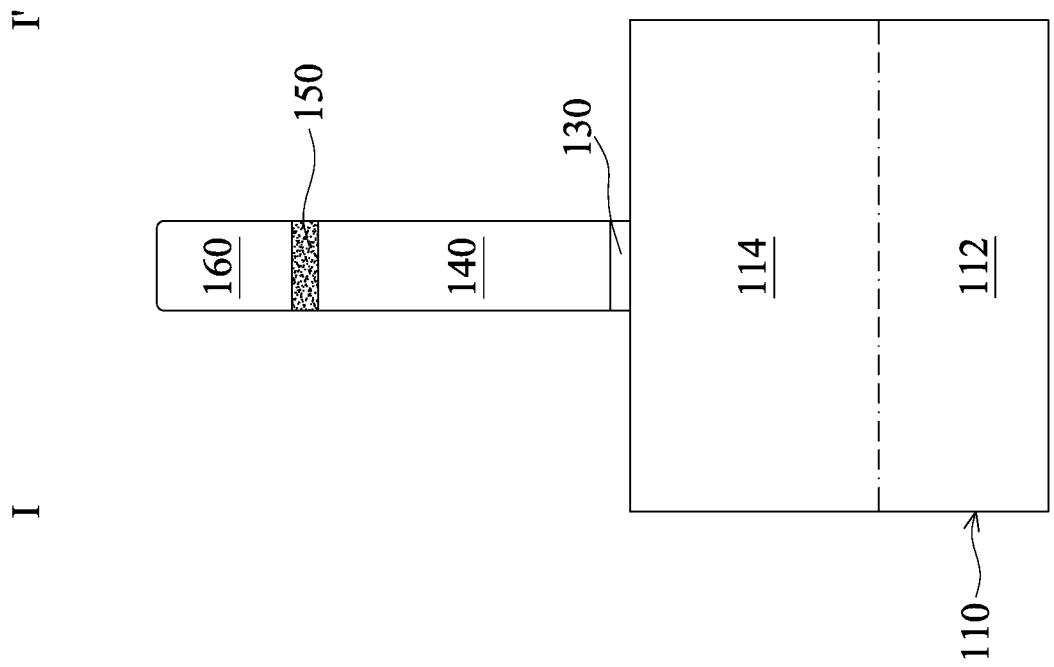
FIGS. 2A-2C are cross-sectional views of various stages of a process for forming a semiconductor device structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1:
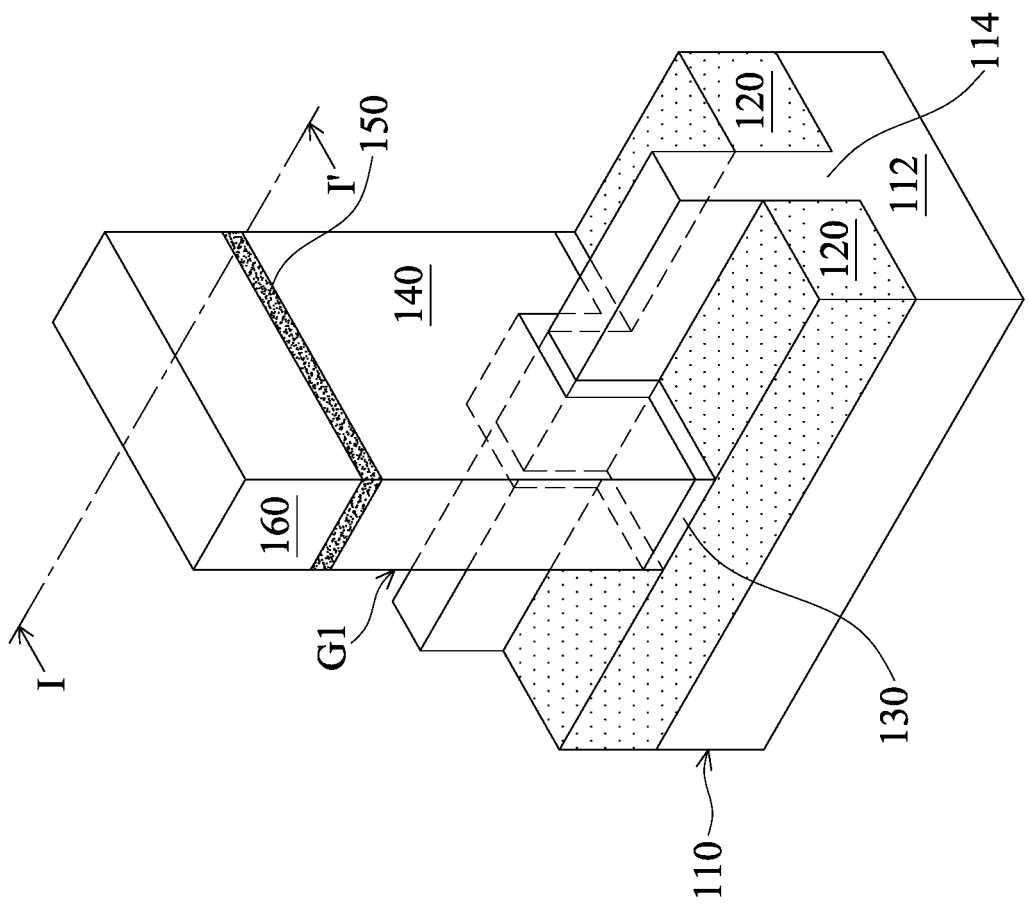
FIG. 1 is a perspective view of a semiconductor device structure, in accordance with some embodiments.
Figure 2C:
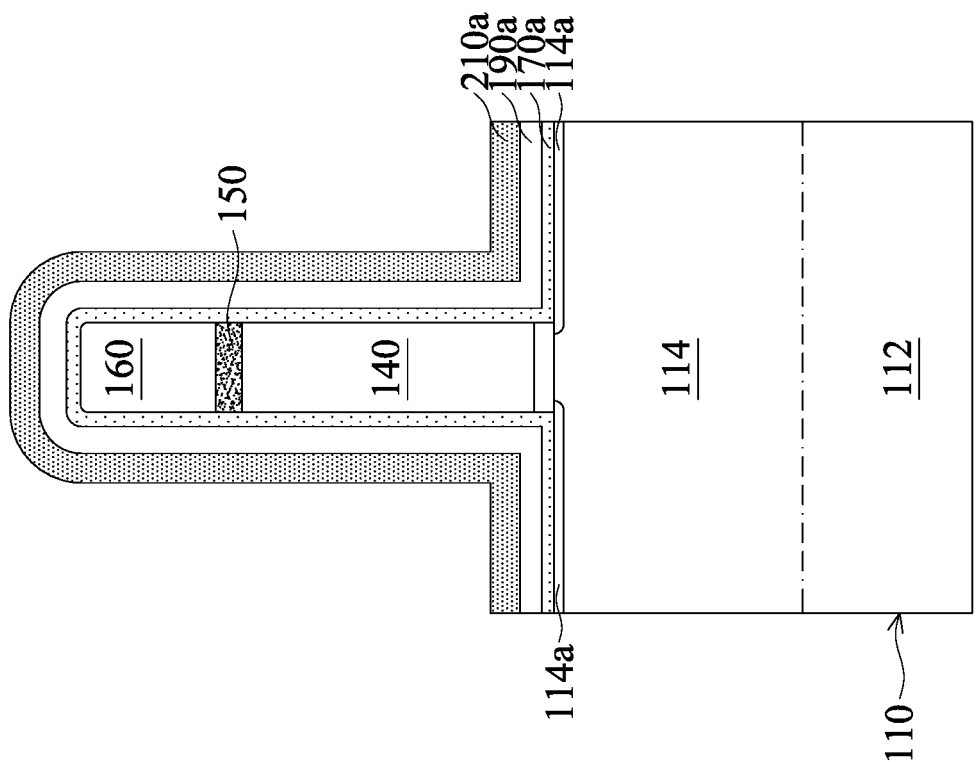
Figure 2B:
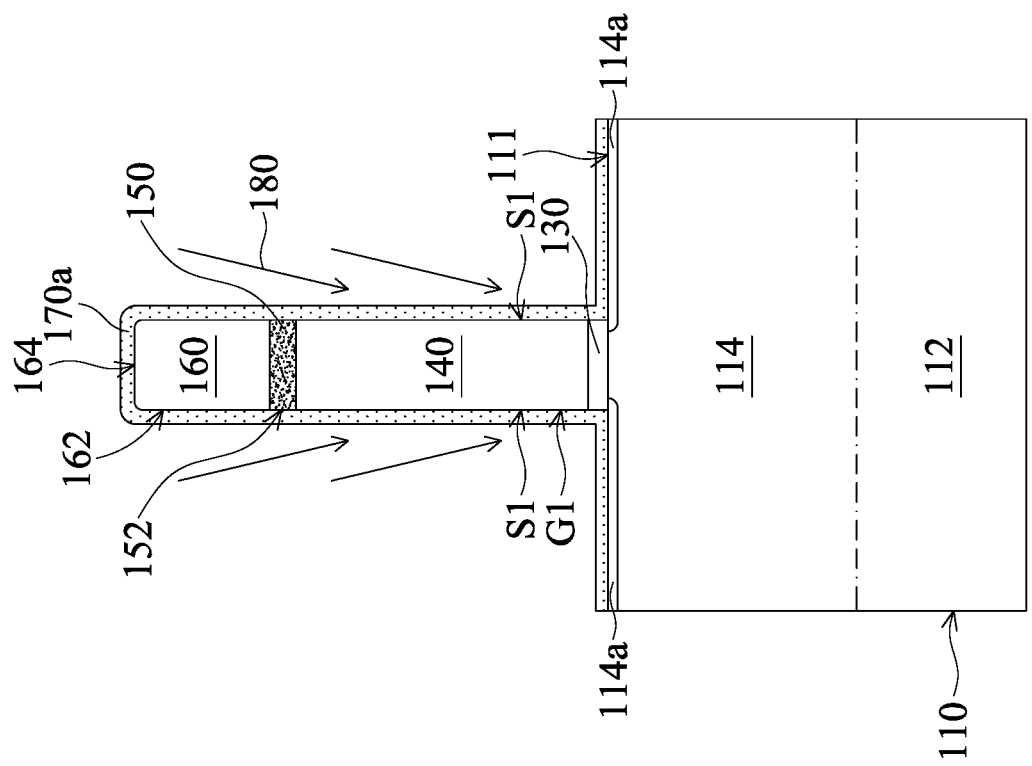

FIG. 1 is a perspective view of a semiconductor device structure, in accordance with some embodiments. FIGS. 2A-2C are cross-sectional views of various stages of a process for forming a semiconductor device structure, in accordance with some embodiments. FIG. 2A is a cross-sectional view illustrating the semiconductor device structure along a sectional line I-I' in FIG. 1, in accordance with some embodiments.

As shown in FIGS. 1 and 2A, a substrate 110 is provided, in accordance with some embodiments. The substrate 110 has a base portion 112 and a fin portion 114, in accordance with some embodiments. The fin portion 114 is over the base portion 112, in accordance with some embodiments.

The substrate 110 includes, for example, a semiconductor substrate. The substrate 110 includes, for example, a semiconductor wafer (such as a silicon wafer) or a portion of a semiconductor wafer. In some embodiments, the substrate 110 is made of an elementary semiconductor material including silicon or germanium in a single crystal structure, a polycrystal structure, or an amorphous structure.

In some other embodiments, the substrate 110 is made of a compound semiconductor, such as silicon carbide, gallium arsenide, gallium phosphide, indium phosphide, indium arsenide, an alloy semiconductor, such as SiGe or GaAsP, or a combination thereof. The substrate 110 may also include multi-layer semiconductors, semiconductor on insulator (SOI) (such as silicon on insulator or germanium on insulator), or a combination thereof.

In some embodiments, the substrate 110 is a device wafer that includes various device elements. In some embodiments, the various device elements are formed in and/or over the substrate 110. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 110. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 110. The isolation features are used to surround active regions and electrically isolate various device elements formed in and/or over the substrate 110 in the active regions. In some embodiments, the isolation features include shallow trench isolation (STI) features, local oxidation of silicon (LOCOS) features, other suitable isolation features, or a combination thereof.

As shown in FIGS. 1 and 2A, an isolation layer 120 is formed over the base portion 112, in accordance with some embodiments. The fin portion 114 is partially in the isolation layer 120, in accordance with some embodiments. The isolation layer 120 surrounds a lower portion of the fin portion 114, in accordance with some embodiments. The isolation layer 120 includes oxide (such as silicon oxide), in accordance with some embodiments. The isolation layer 120 is formed by a chemical vapor deposition (CVD) process and an etching back process, in accordance with some embodiments.

As shown in FIGS. 1 and 2A, a gate stack G1 and mask layers 150 and 160 are formed over the fin portion 114 and the isolation layer 120, in accordance with some embodiments. The gate stack G1 is wrapped around an upper part of the fin portion 114, in accordance with some embodiments.

The gate stack G1 includes a gate dielectric layer 130 and a gate electrode 140, in accordance with some embodiments. The gate dielectric layer 130 is formed over the fin portion 114 and the isolation layer 120, in accordance with some embodiments. The gate electrode 140 is formed over the gate dielectric layer 130, in accordance with some embodiments.

The gate dielectric layer 130 is made of an insulating material, such as oxide (e.g., silicon oxide), in accordance with some embodiments. The gate electrode 140 is made of a semiconductor material (e.g. polysilicon) or a conductive material (e.g., metal or alloy), in accordance with some embodiments.

The formation of the gate dielectric layer 130 and the gate electrode 140 includes: depositing a gate dielectric material layer (not shown) over the fin portion 114 and the isolation layer 120; depositing a gate electrode material layer (not shown) over the gate dielectric material layer; sequentially forming the mask layers 150 and 160 over the gate electrode material layer, wherein the mask layers 150 and 160 expose portions of the gate electrode material layer; and removing the exposed portions of the gate electrode material layer and the gate dielectric material layer thereunder, in accordance with some embodiments.

In some embodiments, the mask layer 150 serves as a buffer layer or an adhesion layer that is formed between the underlying gate electrode 140 and the overlying mask layer 160. The mask layer 150 may also be used as an etch stop layer when the mask layer 160 is removed or etched, in accordance with some embodiments. The mask layers 150 and 160 are made of different materials, in accordance with some embodiments.

In some embodiments, the mask layer 150 is made of oxide, such as silicon oxide. In some embodiments, the mask layer 150 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer 160 is made of nitride (e.g., silicon nitride), oxynitride (e.g., silicon oxynitride), or another applicable material. In some embodiments, the mask layer 160 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the deposition processes for forming the mask layers 150 and 160, the mask layers 150 and 160 are patterned by a photolithography process and an etching process, so as to expose the portions of the gate electrode material layer.

As shown in FIG. 2B, an inner material layer 170a is deposited over the mask layers 150 and 160, the gate stack G1, and the substrate 110, in accordance with some embodiments. The inner material layer 170a conformally covers sidewalls S1 of the gate stack G1, in accordance with some embodiments. The inner material layer 170a is configured to define the positions of doped regions and source/drain structures formed in subsequent processes, in accordance with some embodiments.

The inner material layer 170a is made of a dielectric material such as oxides (e.g., $Al_2O_3$, SiCO or SiCON) or nitrides (SiCN, SiON or SiN), in accordance with some embodiments. The inner material layer 170a is formed using a deposition process, such as a chemical vapor deposition (CVD) process, an atomic layer deposition (ALD) process, or a physical vapor deposition (PVD) process, in accordance with some embodiments.

Thereafter, as shown in FIG. 2B, a doping process 180 is performed over the substrate 110 to form doped regions 114a in the substrate 110, in accordance with some embodiments. The doped regions 114a are also referred to as lightly doped drain (LDD) regions, in accordance with some embodiments. The doped regions 114a are partially under the gate stack G1, in accordance with some embodiments.

The doping process 180 includes an ion implantation process, in accordance with some embodiments. The dopants used by the doping process 180 include N-type dopants, such as phosphorus (P) or arsenic (As), or P-type dopants, such as boron (B), in accordance with some embodiments.

Thereafter, as shown in FIG. 2C, a middle material layer 190a is deposited over the inner material layer 170a, in accordance with some embodiments. The middle material layer 190a conformally covers the inner material layer 170a, in accordance with some embodiments. The middle material layer 190a is configured to define the position of source/drain structures formed in a subsequent process, in accordance with some embodiments.

The middle material layer 190a is made of a dielectric material such as oxides (e.g., $Al_2O_3$, SiCO or SiCON) or nitrides (SiCN, SiON or SiN), in accordance with some embodiments. In some embodiments, the inner material layer 170a and the middle material layer 190a are made of different materials. The middle material layer 190a is formed using a deposition process, such as a chemical vapor deposition (CVD) process, an atomic layer deposition (ALD) process, or a physical vapor deposition (PVD) process, in accordance with some embodiments.

As shown in FIG. 2C, an outer material layer 210a is deposited over the middle material layer 190a, in accordance with some embodiments. The outer material layer 210a conformally covers the middle material layer 190a, in accordance with some embodiments. The outer material layer 210a is configured to define the position of source/drain structures formed in a subsequent process, in accordance with some embodiments.

The outer material layer 210a is made of a dielectric material such as oxides (e.g., $Al_2O_3$, SiCO or SiCON) or nitrides (SiCN, SiON or SiN), in accordance with some embodiments. The outer material layer 210a and the middle material layer 190a are made of different materials, in accordance with some embodiments.

The dielectric constant of the outer material layer 210a is greater than the dielectric constant of the middle material layer 190a, in accordance with some embodiments. The dielectric constant of the middle material layer 190a is greater than or equal to the dielectric constant of the inner material layer 170a, in accordance with some embodiments.

The outer material layer 210a is formed using a deposition process, such as a chemical vapor deposition (CVD) process, an atomic layer deposition (ALD) process, or a physical vapor deposition (PVD) process, in accordance with some embodiments.

Figure 3:
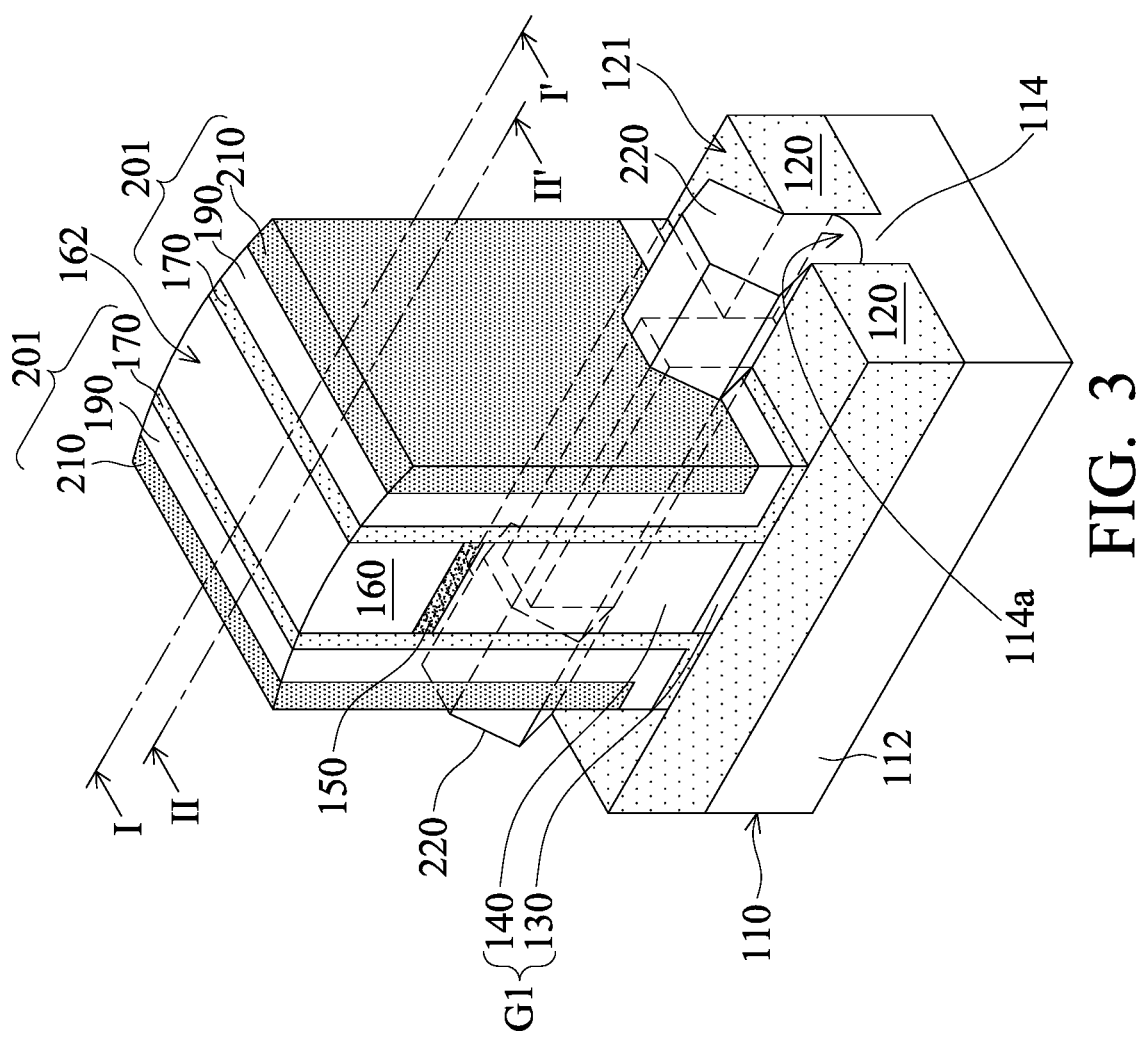
FIG. 3 is a perspective view of a semiconductor device structure, in accordance with some embodiments.
Figures 2, 4A:
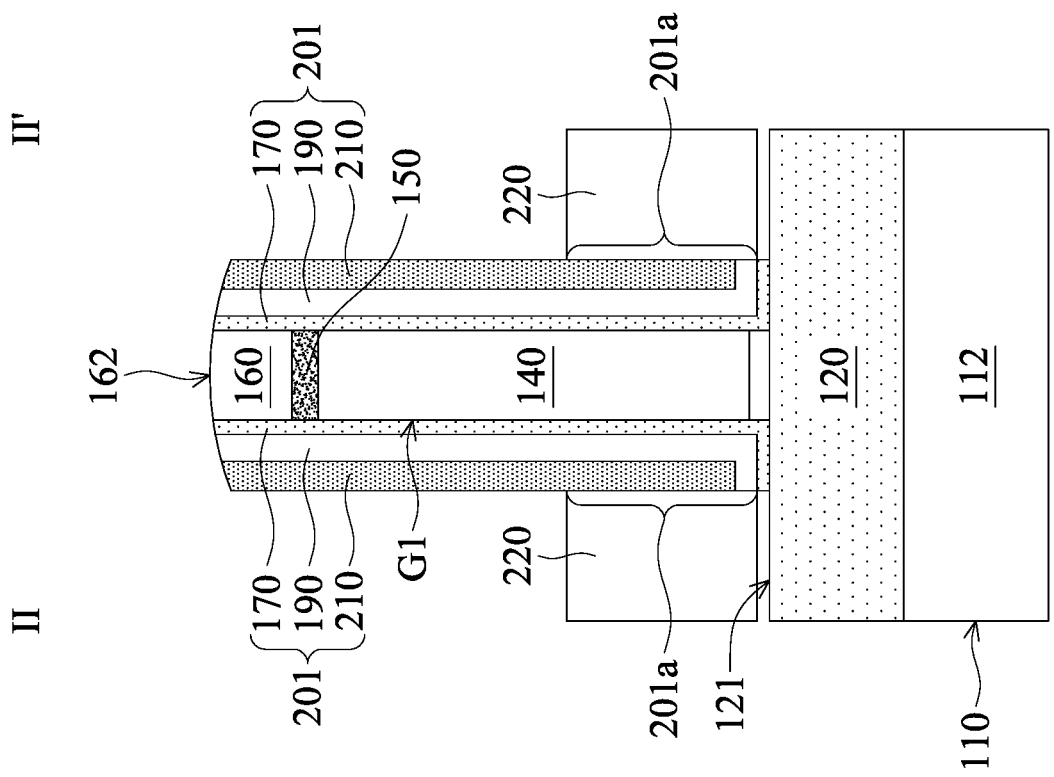
Figures 1, 4A:
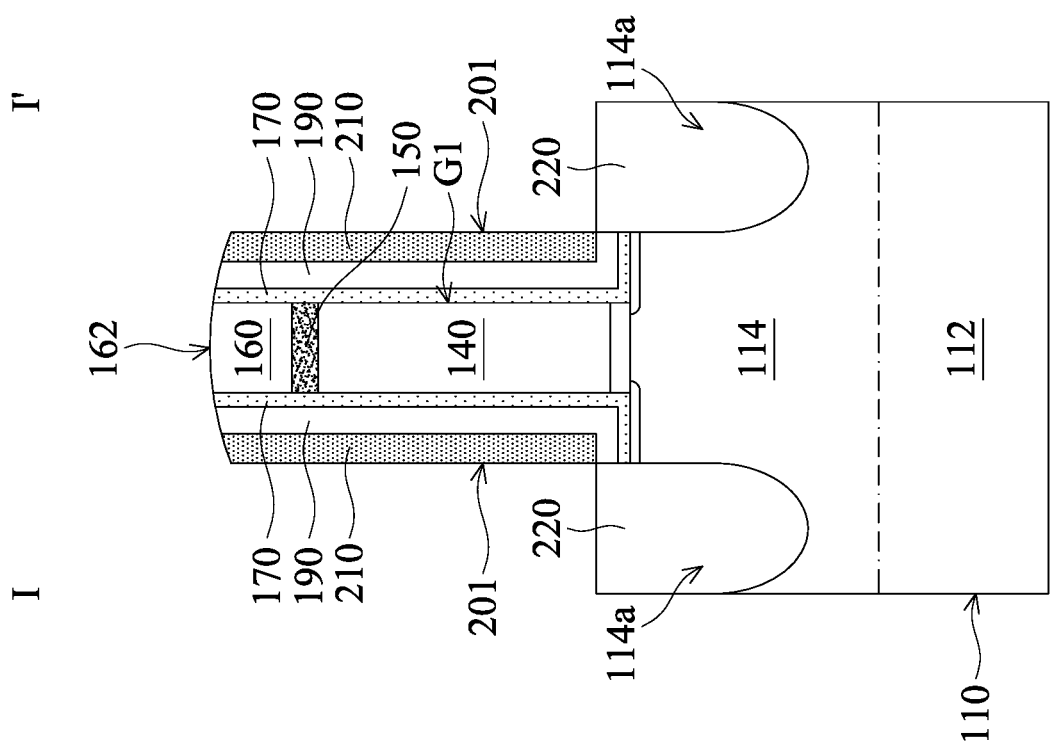

FIG. 3 is a perspective view of a semiconductor device structure, in accordance with some embodiments. FIG. 4A-1 is a cross-sectional view illustrating the semiconductor device structure along a sectional line I-I' in FIG. 3, in accordance with some embodiments. FIG. 4A-2 is a cross-sectional view illustrating the semiconductor device structure along a sectional line II-II' in FIG. 3, in accordance with some embodiments.

As shown in FIGS. 2C, 3, 4A-1, and 4A-2, the outer material layer 210a, the middle material layer 190a, and the inner material layer 170a over a top surface 162 of the mask layer 160 and a top surface 121 of the isolation layer 120 are partially removed, in accordance with some embodiments.

The remaining outer material layer 210a forms an outer layer 210, in accordance with some embodiments. The remaining middle material layer 190a forms a middle layer 190, in accordance with some embodiments. The remaining inner material layer 170a forms an inner layer 170, in accordance with some embodiments. The inner layer 170, the middle layer 190, and the outer layer 210 together form a spacer structure 201, in accordance with some embodiments. The spacer structure 201 surrounds the gate stack G1, in accordance with some embodiments.

As shown in FIGS. 3 and 4A-1, portions of the fin portion 114 adjacent to the spacer structure 201 are removed, in accordance with some embodiments. After the removal process, as shown in FIGS. 3 and 4A-1, recesses 114a are formed in the fin portion 114, in accordance with some embodiments. The recesses 114a are configured to accommodate source/drain structures formed in a subsequent process, in accordance with some embodiments. The removal process includes an etching process, such as an anisotropic etching process (e.g., a dry etching process), in accordance with some embodiments.

As shown in FIGS. 3, 4A-1, and 4A-2, source/drain structures 220 are formed in the recesses 114a and over the fin portion 114, in accordance with some embodiments. In some embodiments, a lower portion 201a of the spacer structure 201 is between the source/drain structures 220 and the gate stack G1.

The source/drain structures 220 are in direct contact with the fin portion 114, in accordance with some embodiments. The source/drain structures 220 are positioned on two opposite sides of the gate stack G1, in accordance with some embodiments. The source/drain structures 220 include a source structure and a drain structure, in accordance with some embodiments.

The source/drain structures 220 are made of an N-type conductivity material, in accordance with some embodiments. The N-type conductivity material includes silicon phosphorus (SiP) or another suitable N-type conductivity material.

The source/drain structures 220 are doped with the Group VA element, in accordance with some embodiments. The Group VA element includes phosphor (P), antimony (Sb), or another suitable Group VA material. In some embodiments, a concentration of the Group VA element (e.g. phosphor) ranges from about 3E21 atoms/cm$^3$ to about 7E21 atoms/cm$^3$. The source/drain structures 220 are also referred to as doped structures, in accordance with some embodiments.

In some other embodiments, the source/drain structures 220 are made of a P-type conductivity material, in accordance with some embodiments. The P-type conductivity material includes silicon germanium (SiGe) or another suitable P-type conductivity material.

The source/drain structures 220 are doped with the Group IIIA element, in accordance with some embodiments. The Group IIIA element includes boron or another suitable material. The source/drain structures 220 are formed using an epitaxial process, in accordance with some embodiments.

Figures 2, 4B:
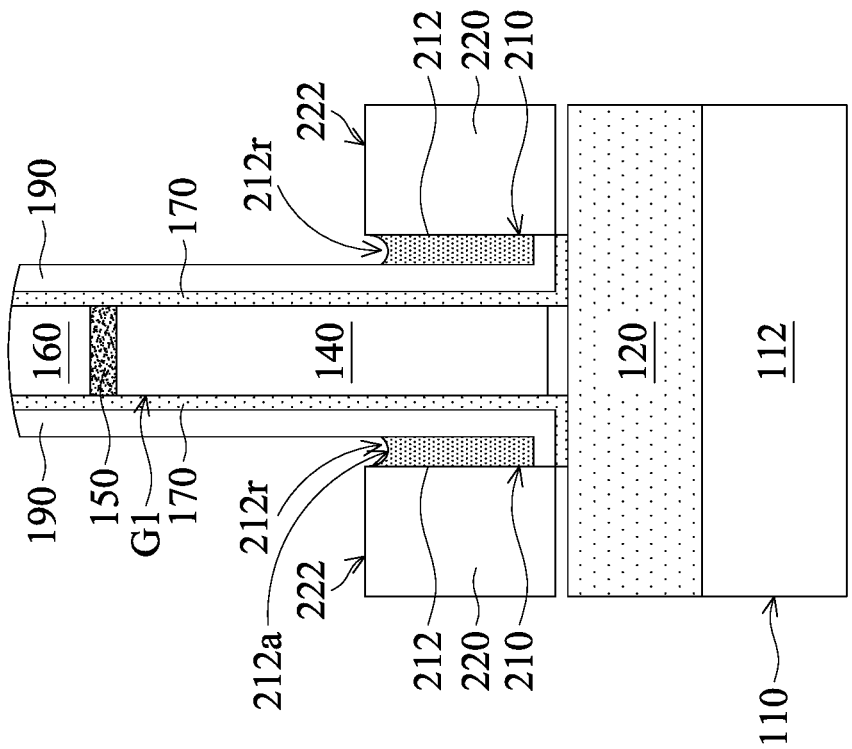
Figures 1, 4B:
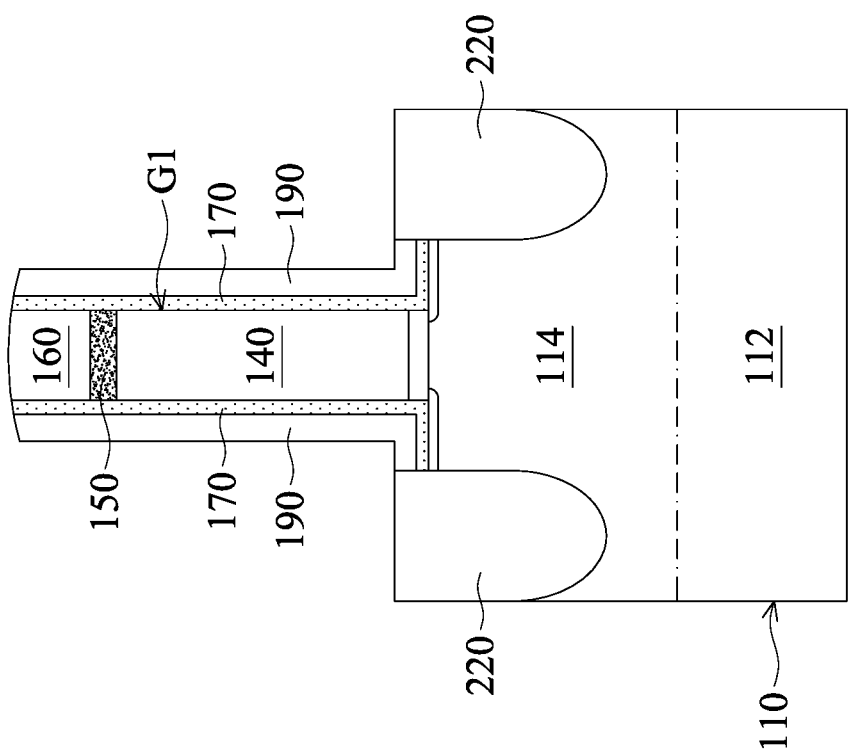
Figures 2, 4C:
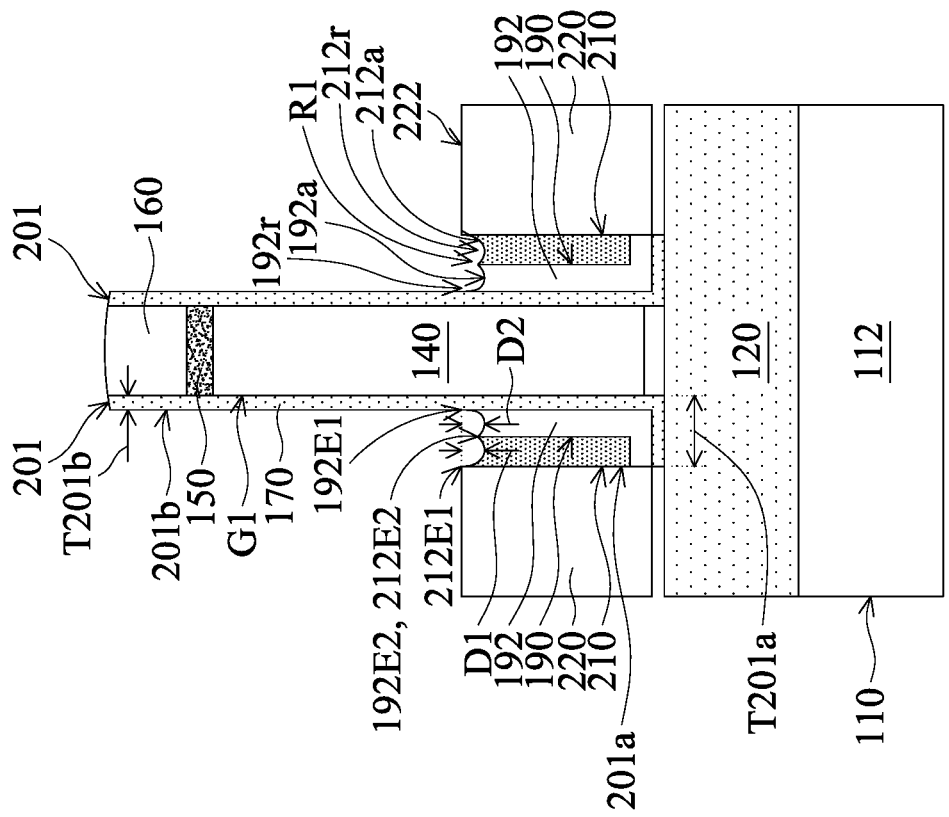
Figures 1, 4C:
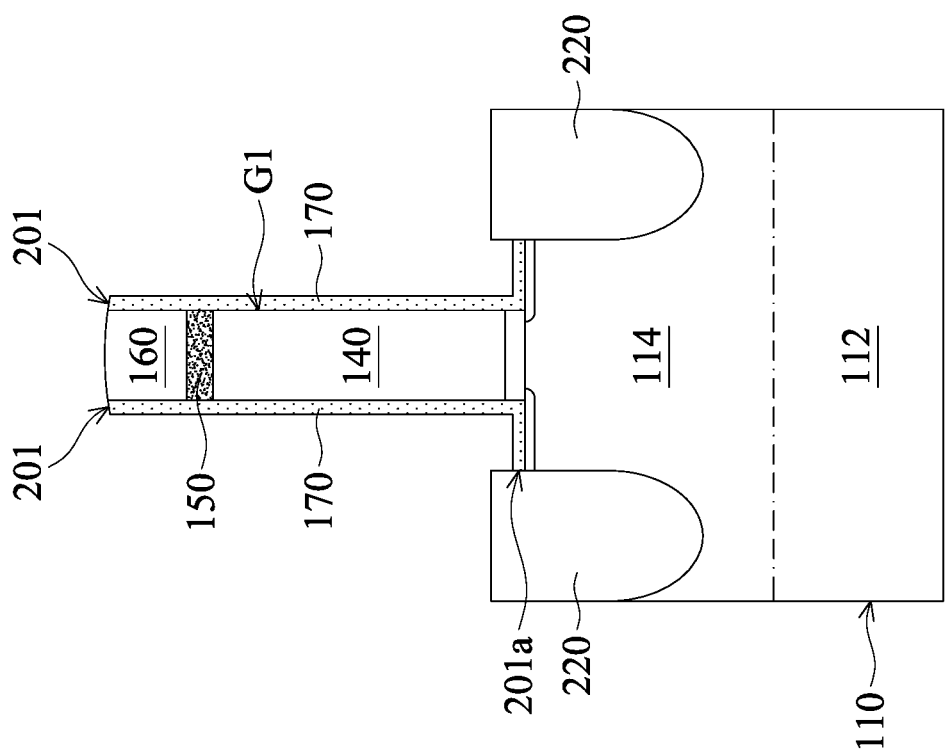
Figures 2, 4D:
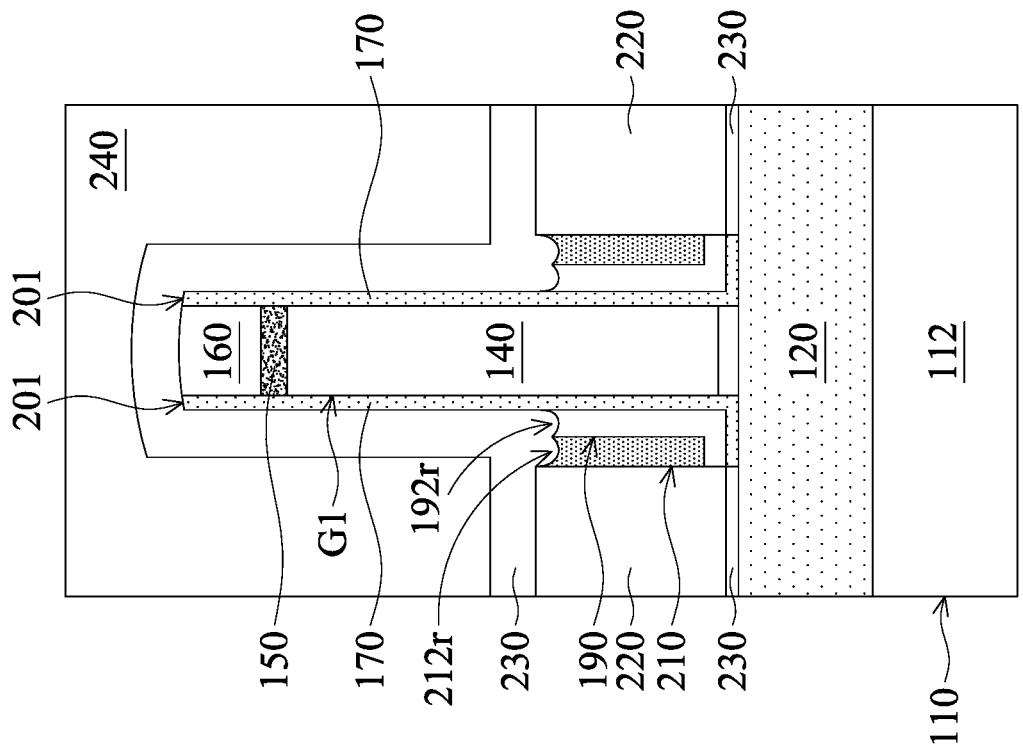
Figures 1, 4D:
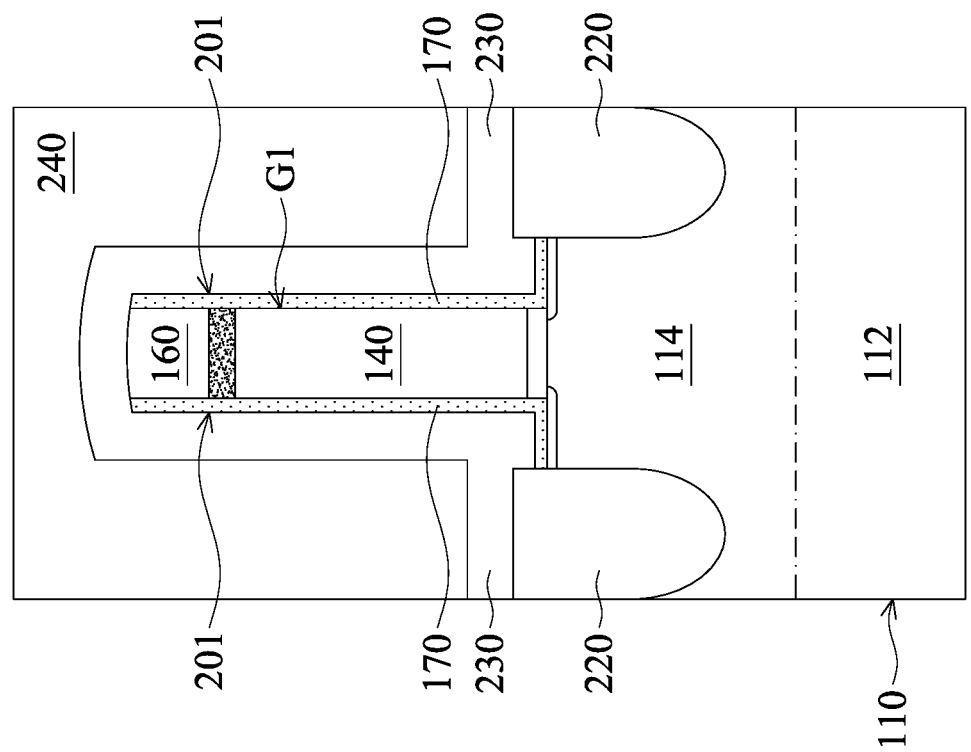
Figures 2, 4E:
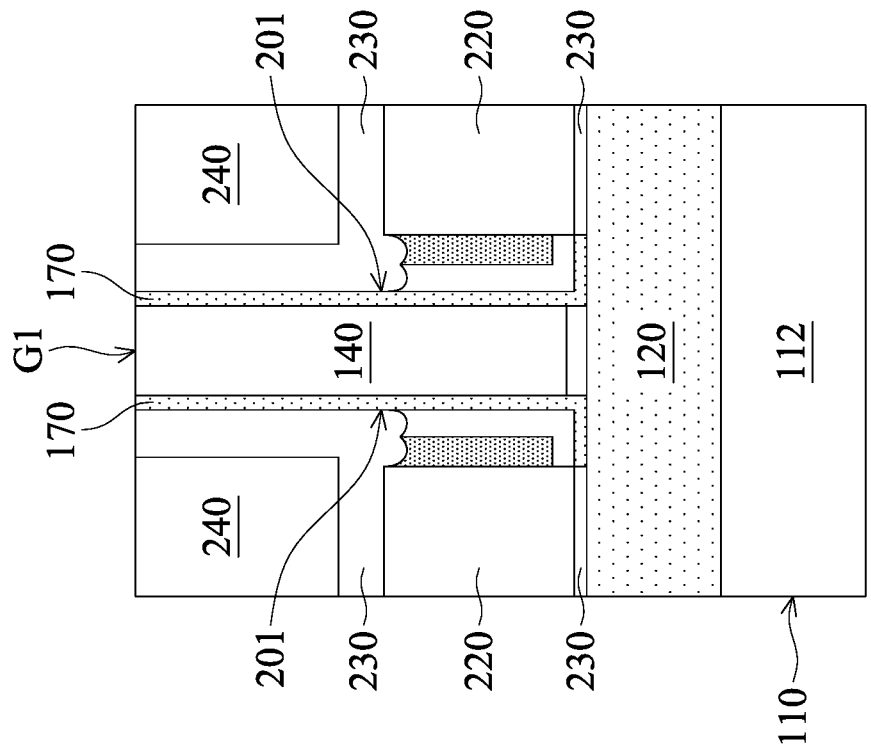
Figures 1, 4E:
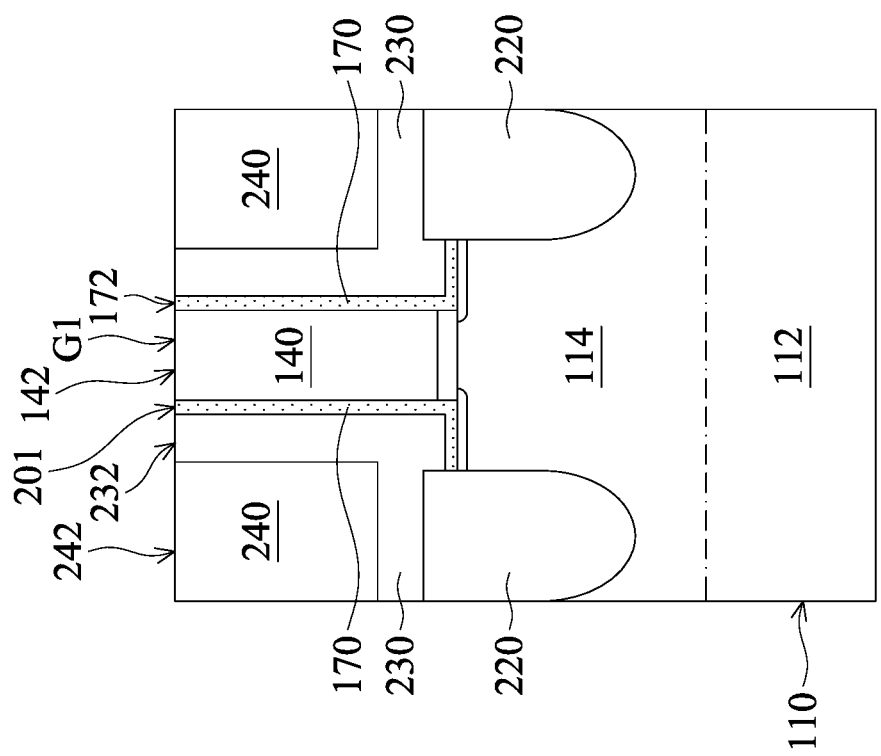
Figures 2, 4F:
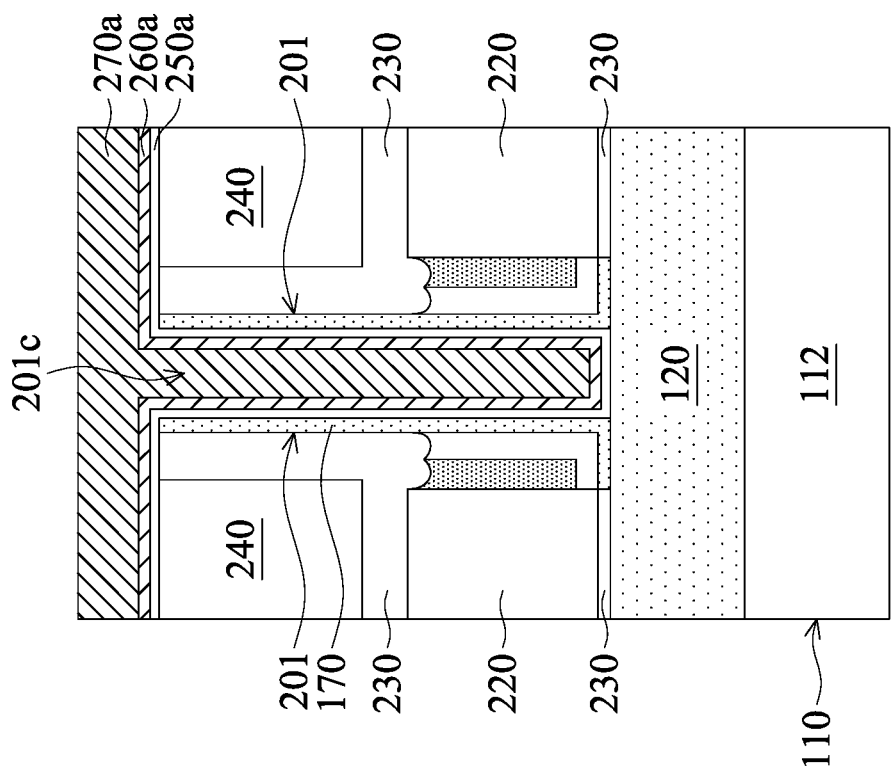
Figures 1, 4F:
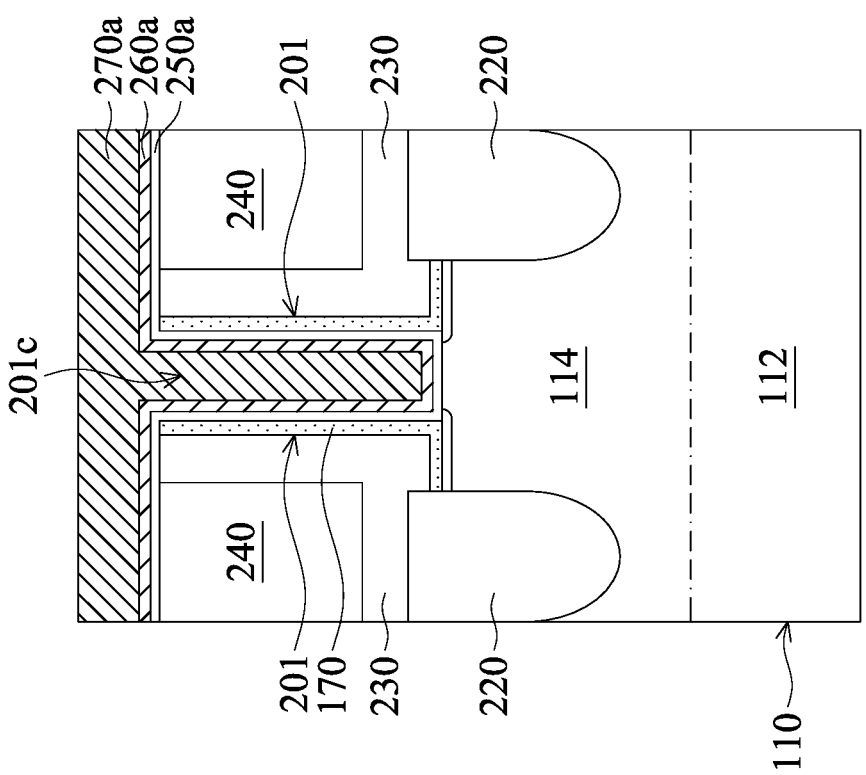
Figures 2, 4G:
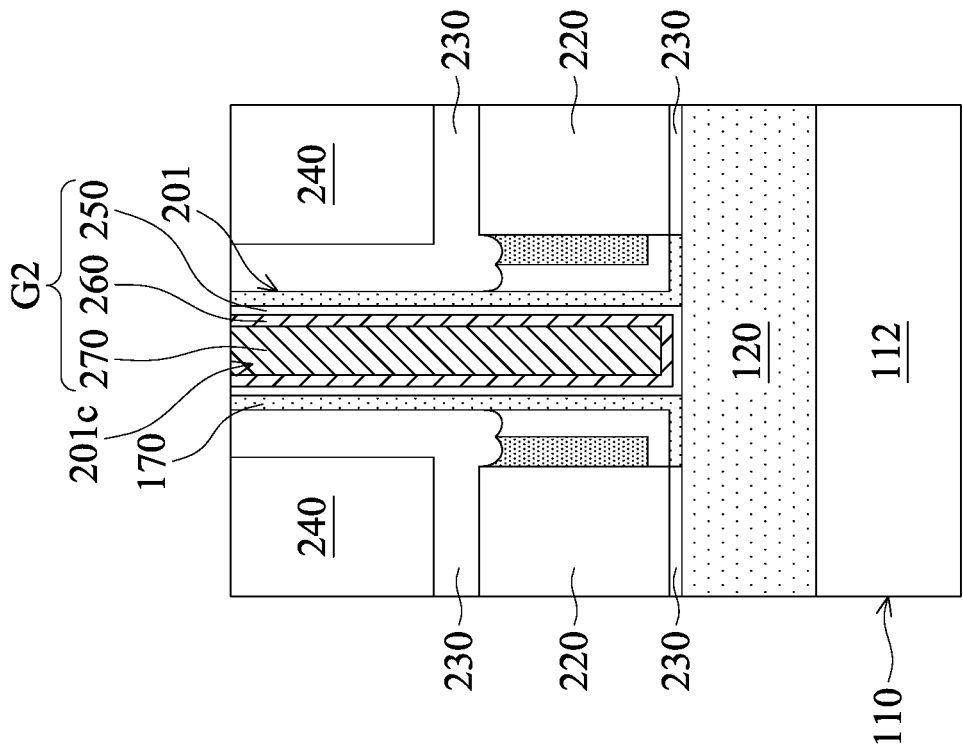
Figures 1, 4G:
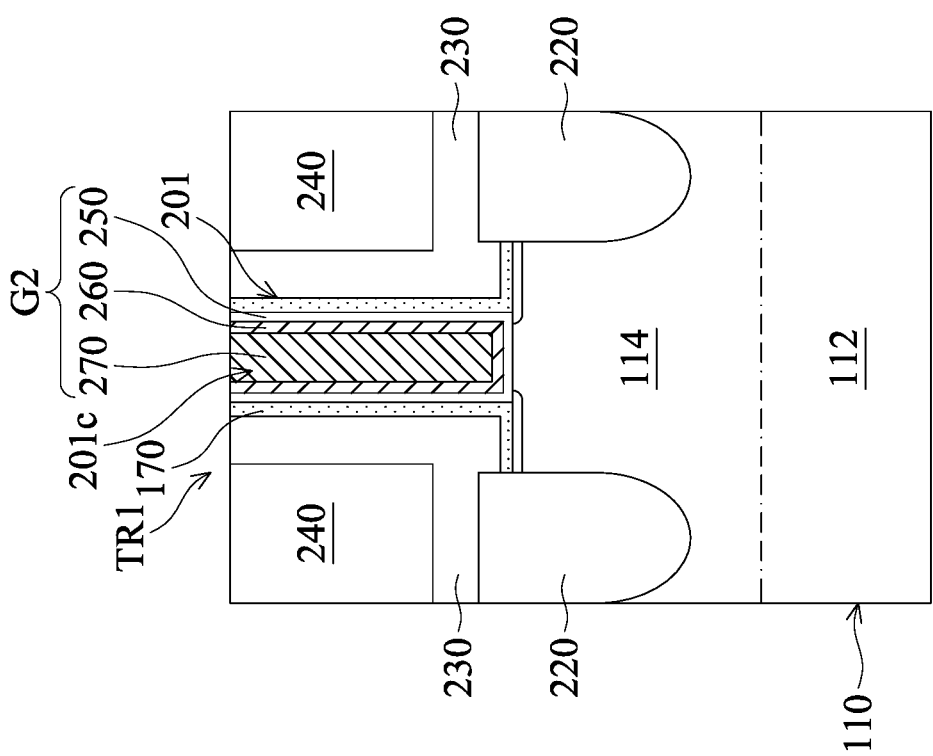
Figures 2, 4H:
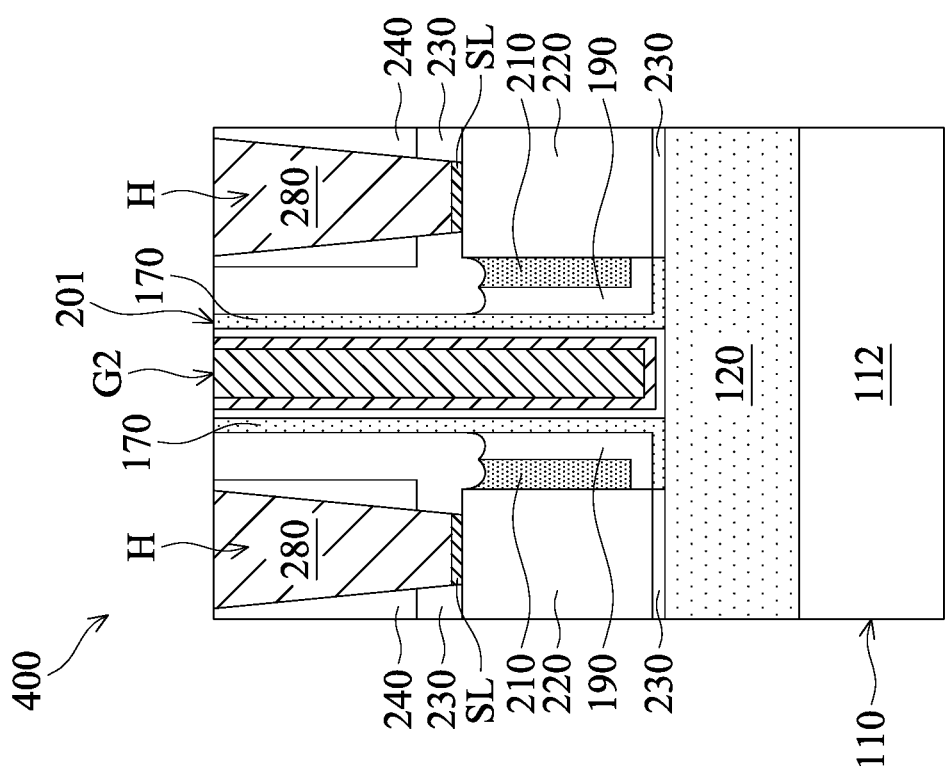
Figures 1, 4H:
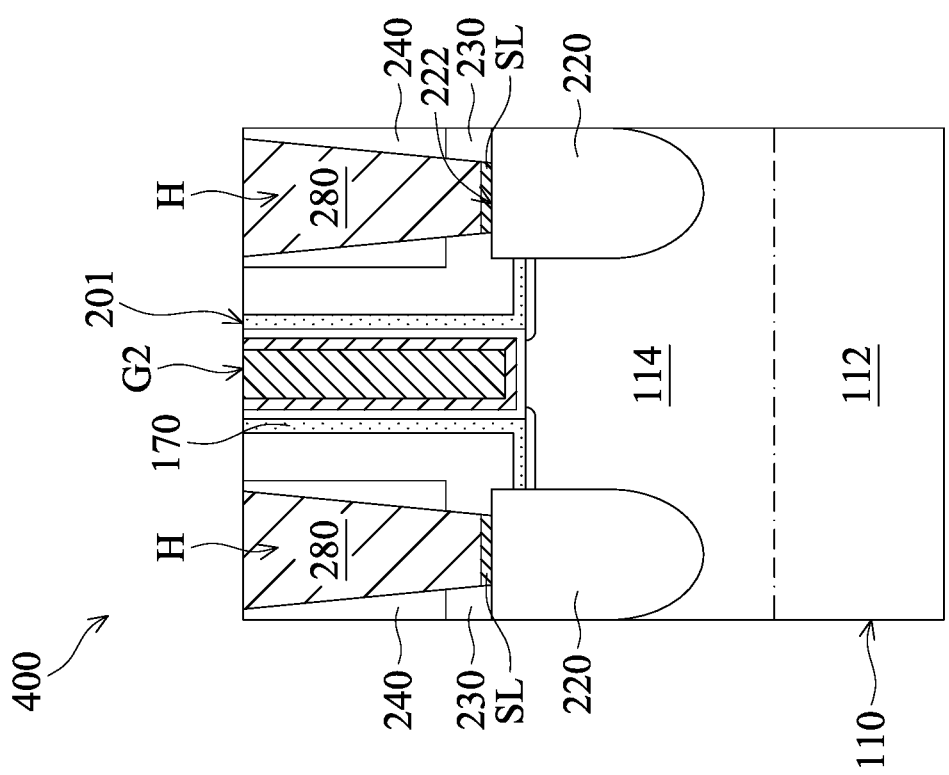

FIGS. 4A-1 to 4H-1 are cross-sectional views of various stages of a process for forming a semiconductor device structure, in accordance with some embodiments. FIGS. 4A-2 to 4H-2 are cross-sectional views of various stages of a process for forming a semiconductor device structure, in accordance with some embodiments.

Thereafter, as shown in FIGS. 4B-1 and 4B-2, an upper portion of the outer layer 210 above the source/drain structures 220 is removed, in accordance with some embodiments. In some embodiments, a lower portion 212 of the outer layer 210 remains between the source/drain structures 220 and the gate stack G1. The lower portion 212 has a top surface 212a, in accordance with some embodiments.

As shown in FIGS. 4B-1 and 4B-2, a recess 212r is formed in the top surface 212a of the lower portion 212, in accordance with some embodiments. The top surface 212a is lower than top surfaces 222 of the source/drain structures 220, in accordance with some embodiments. The removal process includes an isotropic etching process, such as a wet etching process, in accordance with some embodiments. In some embodiments, the outer layer 210 is made of silicon nitride, and the etchant used in the wet etching process includes phosphoric acid.

Afterwards, as shown in FIGS. 4C-1 and 4C-2, an upper portion of the middle layer 190 above the source/drain structures 220 is removed, in accordance with some embodiments. As shown in FIG. 4C-2, a lower portion 192 of the middle layer 190 remains between the outer layer 210 and the gate stack G1, in accordance with some embodiments.

The lower portion 192 has a top surface 192a, in accordance with some embodiments. The top surface 192a is lower than the top surface 222 of the source/drain structure 220, in accordance with some embodiments. As shown in FIG. 4C-2, a recess 192r is formed in the top surface 192a of the lower portion 192, in accordance with some embodiments.

The recess 212r in the top surface 212a of the outer layer 210 and the recess 192r in the top surface 192a of the middle layer 190 together form a recess R1, in accordance with some embodiments. The recess R1 has a W-like shape, in accordance with some embodiments. The depth D1 of the recess 212r ranges from about 1 nm to about 6 nm, in accordance with some embodiments. The depth D2 of the recess 192r ranges from about 1 nm to about 6 nm, in accordance with some embodiments.

The recess 212r has opposite edges 212E1 and 212E2, in accordance with some embodiments. The edge 212E1 is adjacent to the source/drain structure 220, in accordance with some embodiments. The edge 212E2 is adjacent to the middle layer 190, in accordance with some embodiments. The edge 212E1 is higher than the edge 212E2, in accordance with some embodiments.

The recess 192r has edges 192E1 and 192E2, in accordance with some embodiments. The edge 192E1 is adjacent to the gate stack G1, in accordance with some embodiments. The edge 192E2 is adjacent to the outer layer 210, in accordance with some embodiments. The edge 192E1 is higher than the edge 192E2, in accordance with some embodiments.

The lower portion 201a of the spacer structure 201 is thicker than an upper portion 201b of the spacer structure 201, in accordance with some embodiments. The thickness T201a of the lower portion 201a is greater than the thickness T201b of the upper portion 201b, in accordance with some embodiments. The spacer structure 201 has an L-like shape, in accordance with some embodiments.

Thereafter, as shown in FIGS. 4D-1 and 4D-2, an etch stop layer 230 is formed over the source/drain structure 220, the spacer structure 201, and the mask layer 160, in accordance with some embodiments. The etch stop layer 230 is filled into the recess 192r of the middle layer 190 and the recess 212r of the outer layer 210, in accordance with some embodiments.

The etch stop layer 230 is made of an insulating material, such as a nitrogen-containing material (e.g., silicon nitride), in accordance with some embodiments. The etch stop layer 230 is formed using a deposition process, such as a chemical vapor deposition (CVD) process, an atomic layer deposition (ALD) process, or a physical vapor deposition (PVD) process, in accordance with some embodiments.

Afterwards, as shown in FIGS. 4D-1 and 4D-2, a dielectric layer 240 is formed over the etch stop layer 230, in accordance with some embodiments. The dielectric layer 240 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The dielectric layer 240 is deposited by any suitable process, such as a CVD process, a spin-on process, a sputtering process, or a combination thereof, in accordance with some embodiments.

Afterwards, as shown in FIGS. 4D-1, 4E-1 and 4E-2, a planarization process is performed on the dielectric layer 240 until a top surface 142 of the gate electrode 140 is exposed, in accordance with some embodiments. After the planarization process is performed, the mask layers 150 and 160 and upper portions of the dielectric layer 240, the etch stop layer 230, the spacer structure 201, and the gate stack G1 are removed, in accordance with some embodiments.

After the planarization process, top surfaces 242, 232, 172, and 142 of the dielectric layer 240, the etch stop layer 230, the inner layer 170, and the gate electrode 140 are substantially level with each other or substantially coplanar with each other, in accordance with some embodiments. The planarization process includes a chemical mechanical polishing (CMP) process, in accordance with some embodiments.

Thereafter, a gate replacement process is performed, in accordance with some embodiments. As shown in FIGS. 4F-1 and 4F-2, the gate stack G1 is removed, in accordance with some embodiments. The removal process includes a wet etching process, in accordance with some embodiments. After the removal process, a trench 201c is formed in the spacer structure 201, in accordance with some embodiments. The trench 201c exposes the fin portion 114, in accordance with some embodiments.

As shown in FIGS. 4F-1 and 4F-2, a gate dielectric material layer 250a is conformally formed in the trench 201c, in accordance with some embodiments. The gate dielectric material layer 250a is made of a dielectric material, such as a high dielectric constant (high-k) material, in accordance with some embodiments.

The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), aluminum oxide, hafnium dioxide-alumina ($HfO_2$—$Al_2O_3$) alloy, other suitable high-k dielectric materials, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

As shown in FIGS. 4F-1 and 4F-2, a work function metal material layer 260a is conformally formed over the gate dielectric material layer 250a, in accordance with some embodiments. The work function metal material layer 260a conformally covers the gate dielectric material layer 250a, in accordance with some embodiments. The work function metal material layer 260a provides a desired work function for transistors to enhance device performance including improved threshold voltage.

In the embodiments of forming an NMOS transistor, the work function metal material layer 260a can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function metal material layer 260a can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or a combination thereof.

The work function metal material layer 260a is formed using a deposition process, in accordance with some embodiments. The deposition process includes a physical vapor deposition (PVD) process, a CVD process, an atomic layer deposition (ALD), a plating process, another suitable method, or a combination thereof.

Afterwards, as shown in FIGS. 4F-1 and 4F-2, a gate electrode material layer 270a is deposited over the work function metal material layer 260a to fill the trench 201c of the spacer structure 201, in accordance with some embodiments. The gate electrode material layer 270a is made of a suitable metal material, such as aluminum, tungsten, gold, platinum, cobalt, another suitable metal, an alloy thereof, or a combination thereof, in accordance with some embodiments.

Afterwards, as shown in FIGS. 4G-1 and 4G-2, portions of the gate electrode material layer 270a, the work function metal material layer 260a, and the gate dielectric material layer 250a outside of the trench 201c of the spacer structure 201 are removed, in accordance with some embodiments.

The remaining gate electrode material layer 270a forms a gate electrode layer 270, in accordance with some embodiments. The remaining work function metal material layer 260a forms a work function metal layer 260, in accordance with some embodiments. The remaining gate dielectric material layer 250a forms a gate dielectric layer 250, in accordance with some embodiments.

The gate electrode layer 270, the work function metal layer 260, and the gate dielectric layer 250 together form a gate stack G2, in accordance with some embodiments. The gate stack G2 and the source/drain structures 220 together form a transistor TRI, in accordance with some embodiments.

Thereafter, as shown in FIGS. 4H-1 and 4H-2, portions of the dielectric layer 240 and the etch stop layer 230 are removed to form contact holes H in the dielectric layer 240 and the etch stop layer 230, in accordance with some embodiments. The contact holes H pass though the dielectric layer 240 and the etch stop layer 230, in accordance with some embodiments. The contact hole H partially exposes the top surface 222 of the source/drain structure 220 thereunder, in accordance with some embodiments.

Afterwards, a metal layer (not shown) is formed over the source/drain structures 220, in accordance with some embodiments. The metal layer is made of Ti, Co, Ru, or another suitable metal material. The metal layer is formed using a deposition process, such as a physical vapor deposition process, a plating process, another suitable method, or a combination thereof, in accordance with some embodiments.

Thereafter, as shown in FIGS. 4H-1 and 4H-2, the metal layer and the source/drain structures 220 are annealed to react the metal layer with the source/drain structures 220 so as to form a silicide layer SL between the metal layer and the source/drain structures 220, in accordance with some embodiments. The silicide layer SL is in direct contact with the source/drain structures 220, in accordance with some embodiments. The silicide layer SL includes $TiSi_2$ (titanium disilicide), $CoSi_2$, or RuSi, in accordance with some embodiments.

As shown in FIGS. 4H-1 and 4H-2, the metal layer, which has not reacted with the source/drain structures 220, is removed, in accordance with some embodiments. The removal process includes an etching process such as a wet etching process or a dry etching process, in accordance with some embodiments.

As shown in FIGS. 4H-1 and 4H-2, contact structures 280 are formed in the contact holes H, in accordance with some embodiments. The contact structures 280 pass through the dielectric layer 240 and the etch stop layer 230 to connect to the silicide layer SL, in accordance with some embodiments.

The formation of the contact structures 280 includes depositing a conductive material layer (not shown) over the dielectric layer 240 and in the contact holes H; and performing a chemical mechanical polishing (CMP) process over the conductive material layer to remove the conductive material layer outside of the contact holes H, in accordance with some embodiments.

The contact structures 280 are made of tungsten (W) or another suitable conductive material, in accordance with some embodiments. In this step, a semiconductor device structure 400 is substantially formed, in accordance with some embodiments.

Since the embodiment removes the upper portions of the middle layer 190 and the outer layer 210 to enlarge the space for accommodating the contact structures 280, in accordance with some embodiments. Therefore, the yield of the formation of the contact structures 280 is improved, in accordance with some embodiments. Furthermore, the width of the contact structure 280 is able to be enlarged, which reduces the contact resistance between the contact structure 280 and the source/drain structures 220, in accordance with some embodiments. Therefore, the performance of the semiconductor device structure 400 is improved, in accordance with some embodiments.

Since the lower portions of the middle layer 190 and the outer layer 210 remain between the gate stack G2 and the source/drain structures 220, the distance between the gate stack G2 and the source/drain structures 220 is maintained, in accordance with some embodiments. Therefore, the capacitance between the gate stack G2 and the source/drain structures 220 is maintained, in accordance with some embodiments.

Furthermore, the width of the contact structure 280 is able to be maintained when the distance between the gate stack G2 and the adjacent gate stack (not shown) is reduced, which helps the semiconductor device structure 400 to be scaled down, in accordance with some embodiments.

In addition, the embodiment removes the upper portions of the middle layer 190 and the outer layer 210 without using masks, which does not increase the cost of the process for forming the semiconductor device structure 400 and increases process compatibility, in accordance with some embodiments.

Figure 5B:
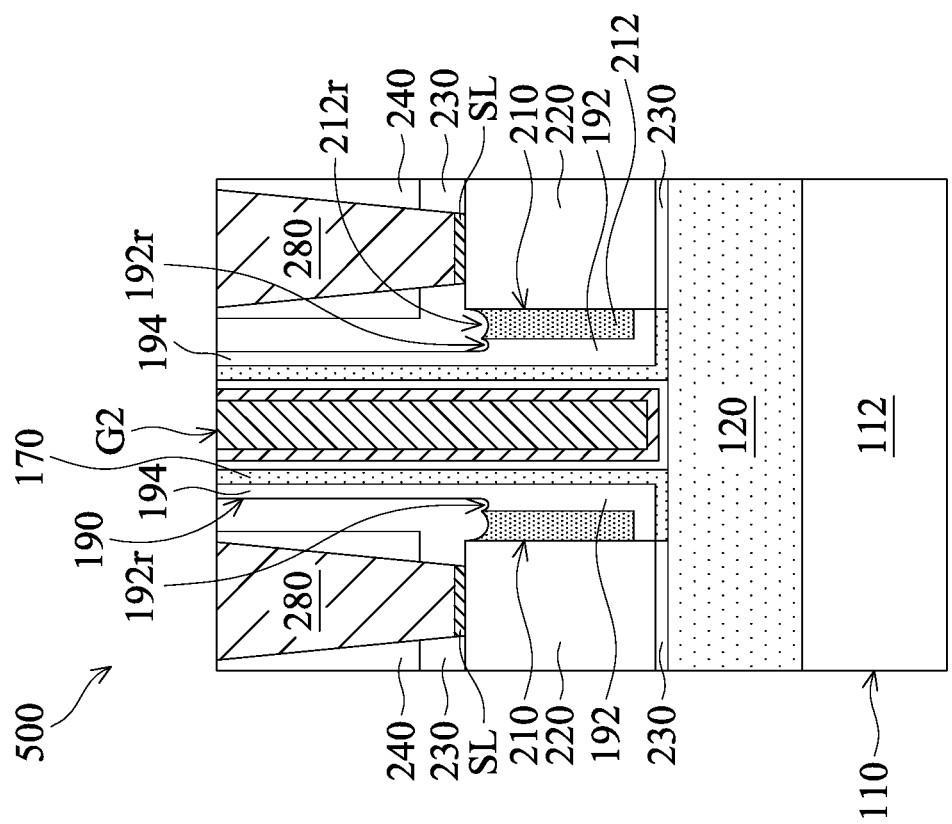
FIG. 5B is a cross-sectional view of a semiconductor device structure, in accordance with some embodiments.
Figure 5A:
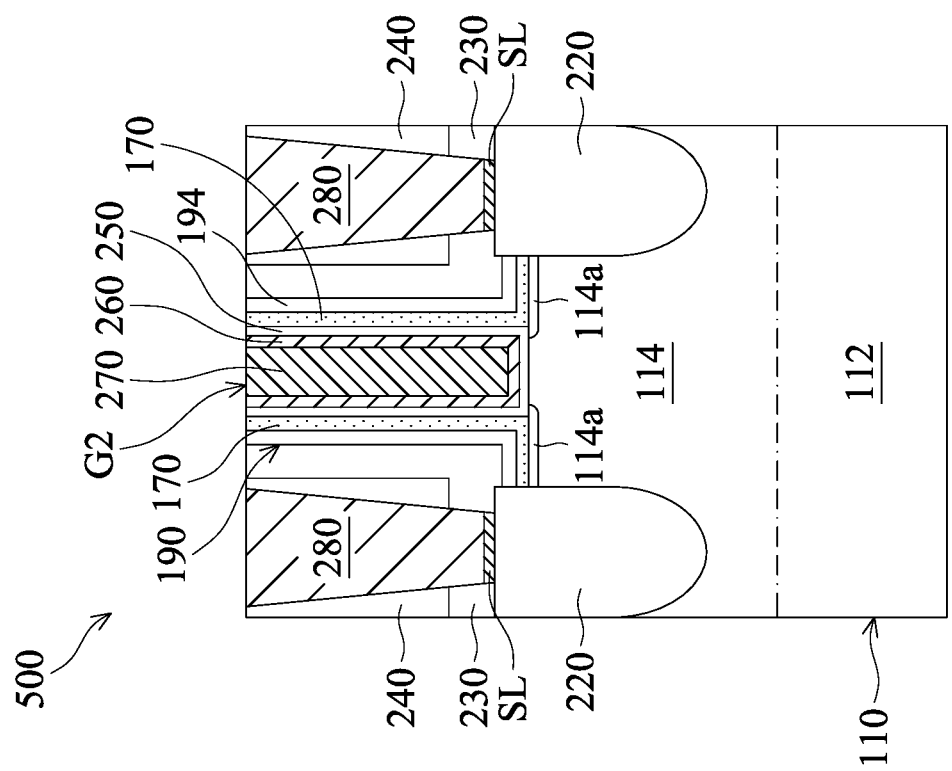
FIG. 5A is a cross-sectional view of a semiconductor device structure, in accordance with some embodiments.

FIG. 5A is a cross-sectional view of a semiconductor device structure, in accordance with some embodiments. FIG. 5B is a cross-sectional view of a semiconductor device structure, in accordance with some embodiments.

After the step of FIGS. 4B-1 and 4B-2, as shown in FIGS. 5A and 5B, an upper portion 194 of the middle layer 190 is thinned, in accordance with some embodiments. After the thinning process, the upper portion 194 is thinner than the lower portion 192 of the middle layer 190, in accordance with some embodiments.

The upper portion 194 is over the source/drain structures 220, in accordance with some embodiments. The lower portion 192 is between the source/drain structures 220 and the gate stack G1 (or the gate stack G2), in accordance with some embodiments.

The thinning process forms a recess 192r in the lower portion 192, in accordance with some embodiments. The recess 192r is narrower than the lower portion 192, in accordance with some embodiments. The recess 192r is narrower than the recess 212r in the lower portion 212 of the outer layer 210, in accordance with some embodiments. The thinning process includes a dry etching process or another suitable etching process, in accordance with some embodiments.

Thereafter, the steps of FIGS. 4D-1 to 4H-1 and 4D-2 to 4H-2 are performed to form the etch stop layer 230, the dielectric layer 240, the gate stack G2, which includes the gate dielectric layer 250, the work function metal layer 260, and the gate electrode layer 270, the silicide layer SL, and the contact structures 280, in accordance with some embodiments. In this step, a semiconductor device structure 500 is substantially formed, in accordance with some embodiments.

Figure 6:
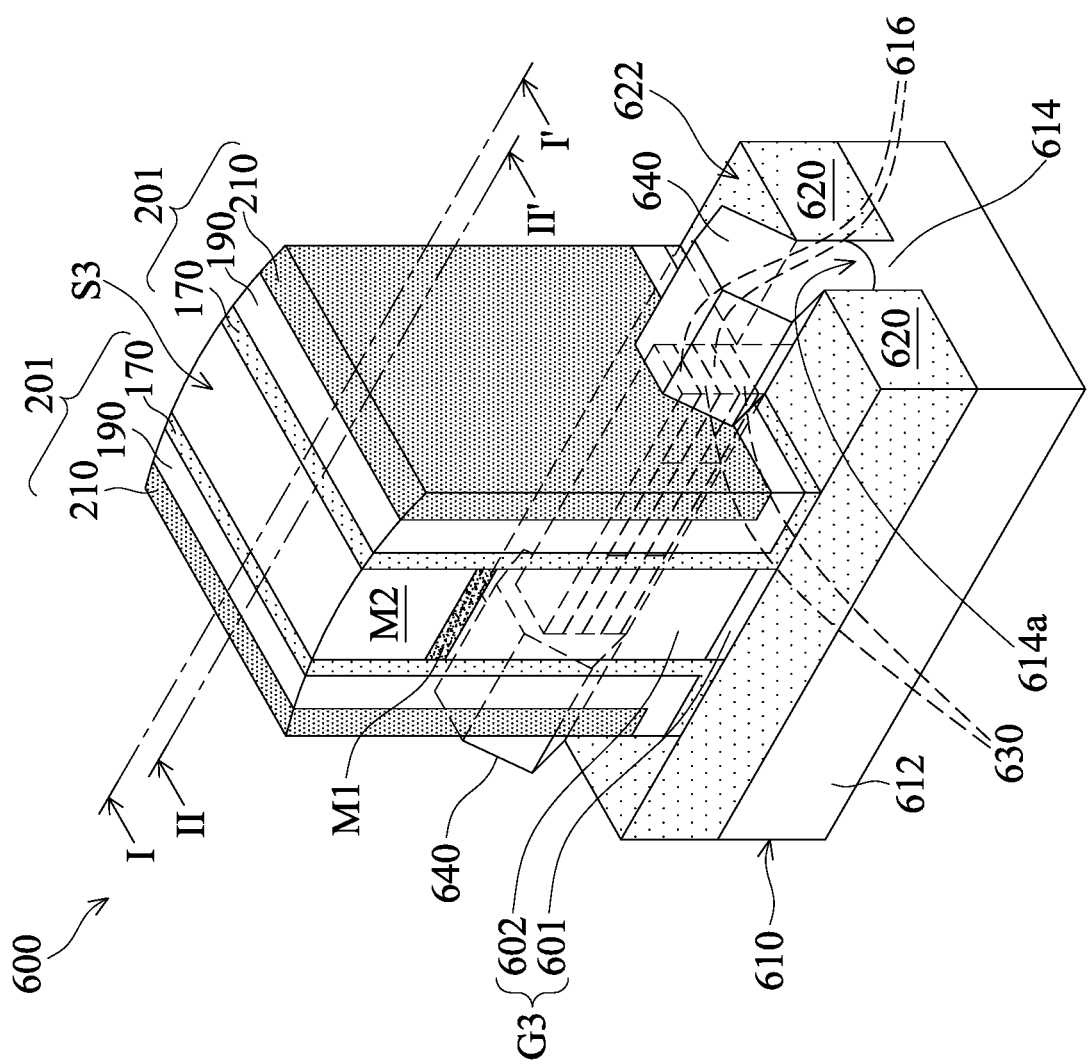
FIG. 6 is a perspective view of a semiconductor device structure, in accordance with some embodiments.

FIG. 6 is a perspective view of a semiconductor device structure 600, in accordance with some embodiments. FIG. 7A-1 is a cross-sectional view illustrating the semiconductor device structure along a sectional line I-I' in FIG. 6, in accordance with some embodiments. FIG. 7A-2 is a cross-sectional view illustrating the semiconductor device structure 600 along a sectional line II-II' in FIG. 6, in accordance with some embodiments.

Figures 2, 7B:
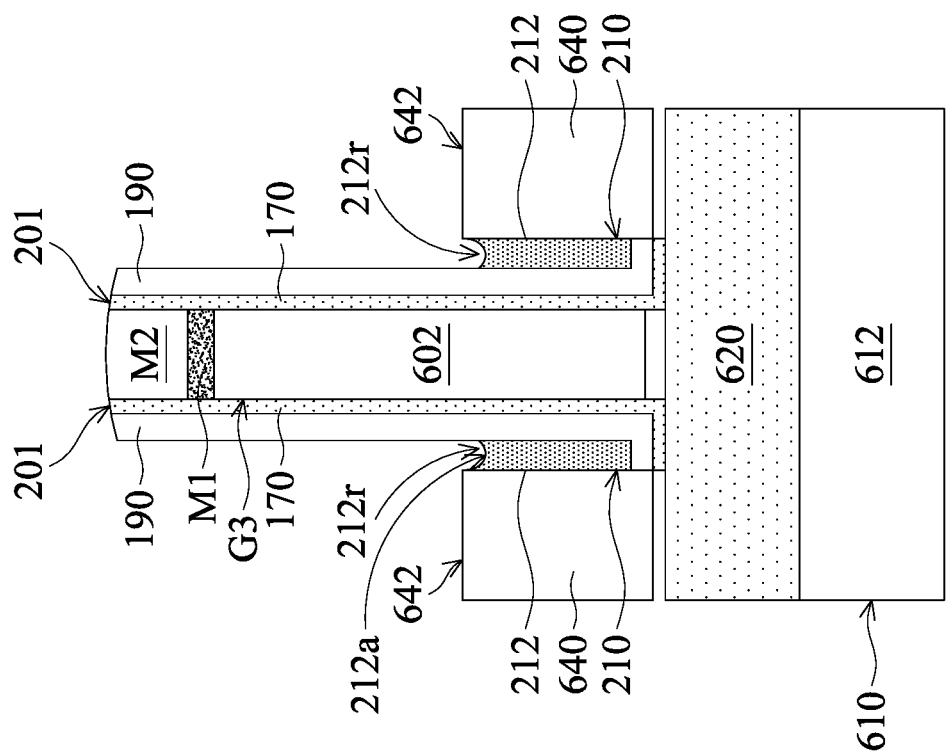
Figures 1, 7B:
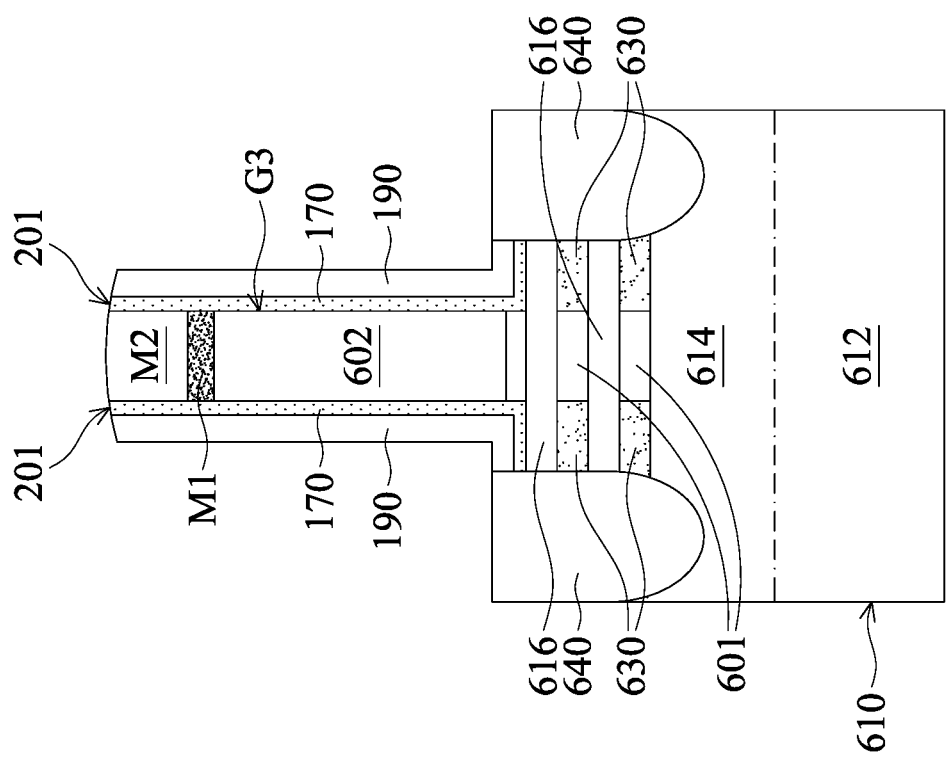
Figures 2, 7C:
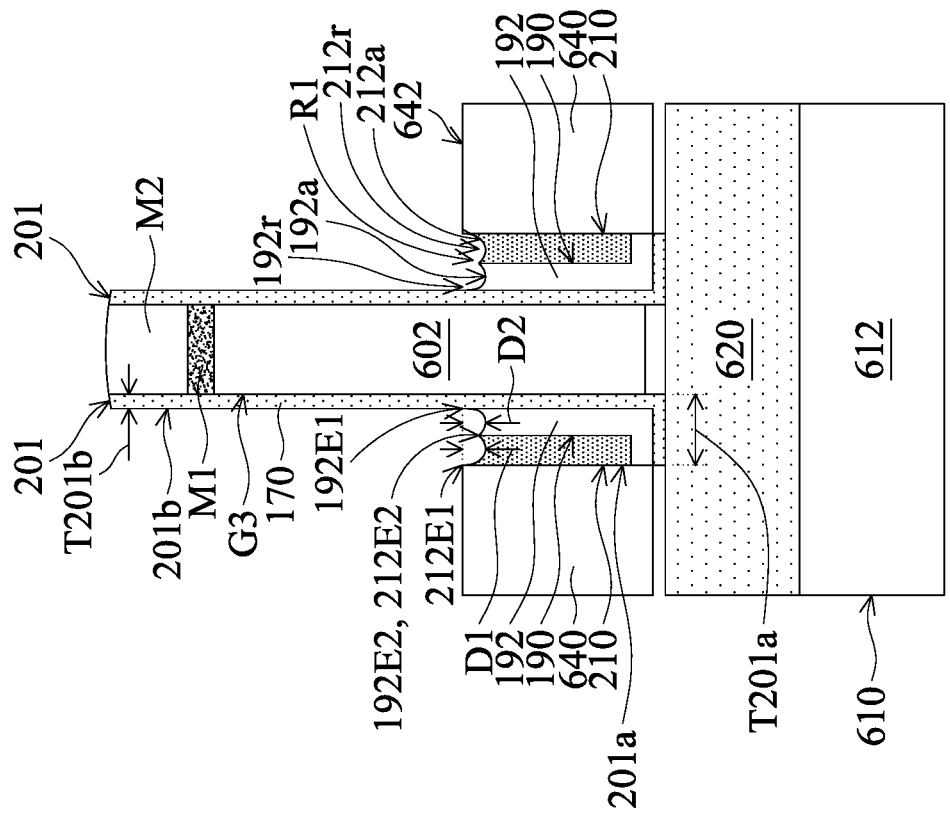
Figures 1, 7C:
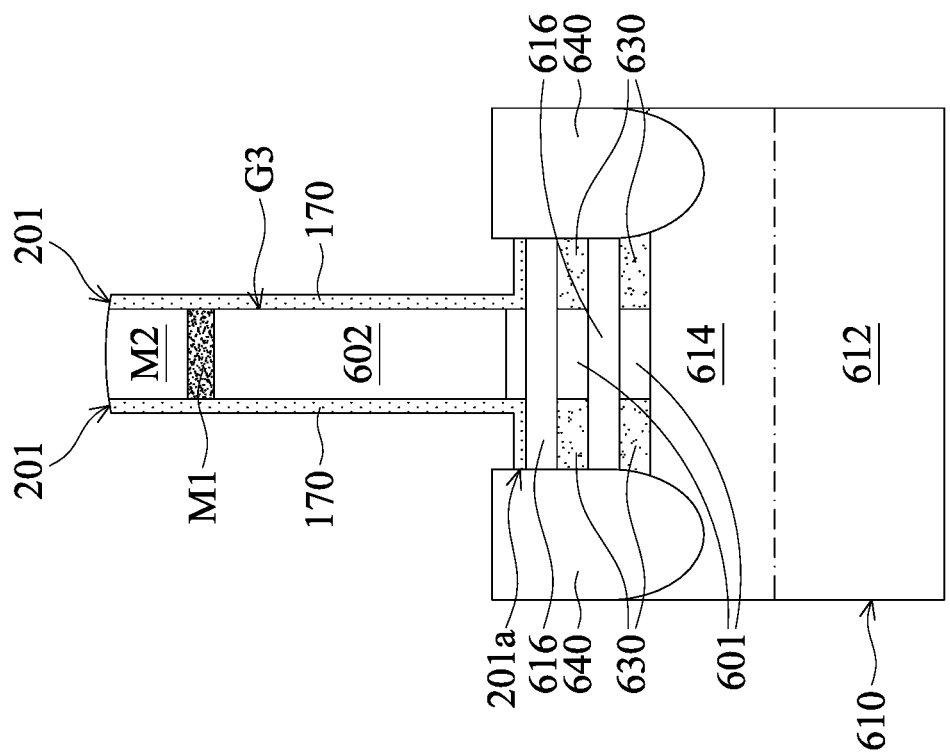
Figures 2, 7E:
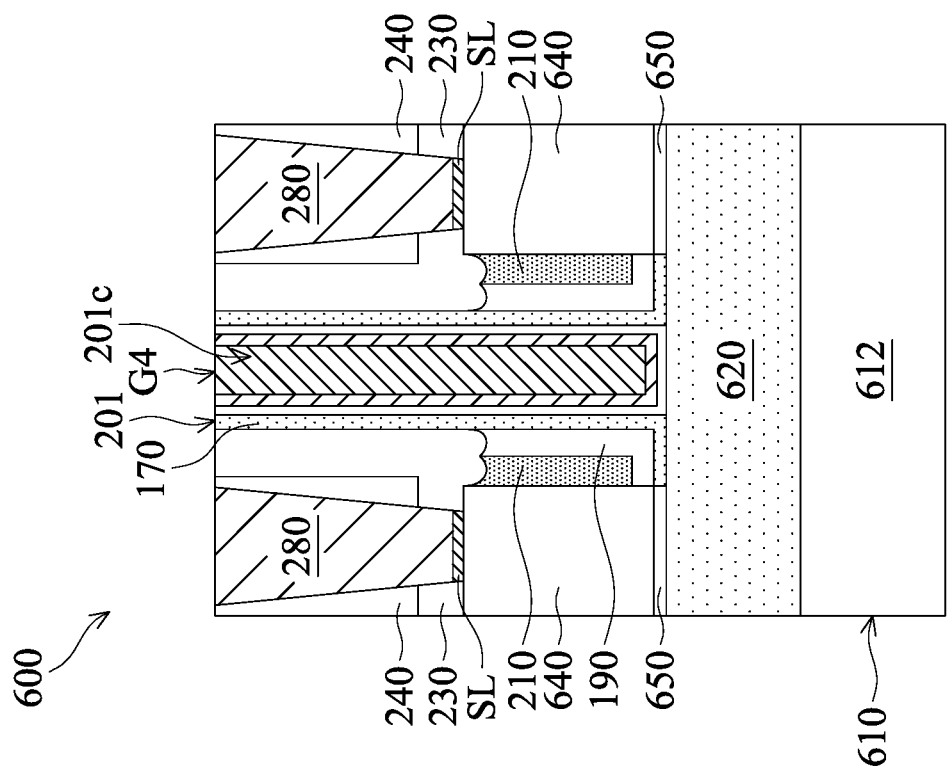
Figures 1, 7E:
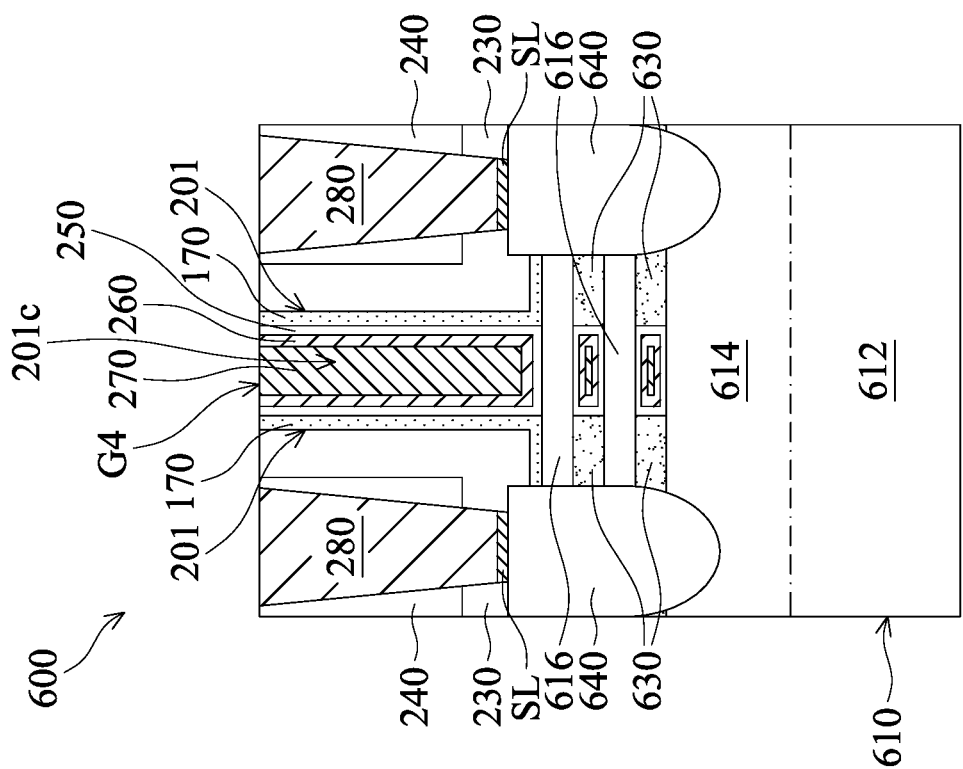

FIGS. 7A-1 to 7E-1 are cross-sectional views of various stages of a process for forming a semiconductor device structure, in accordance with some embodiments. FIGS. 7A-2 to 7E-2 are cross-sectional views of various stages of a process for forming a semiconductor device structure, in accordance with some embodiments.

As shown in FIGS. 6, 7A-1, and 7A-2, a semiconductor device structure 600 is provided, in accordance with some embodiments. The semiconductor device structure 600 includes a substrate 610, nanostructures 601, an isolation layer 620, a gate stack G3, a spacer structure 201, an inner spacer 630, source/drain structures 640, and mask layers M1 and M2, in accordance with some embodiments.

The substrate 610 has a base portion 612, a fin portion 614, and nanostructures 616, in accordance with some embodiments. The fin portion 614 is over the base portion 612, in accordance with some embodiments. The nanostructures 616 are over the fin portion 614, in accordance with some embodiments.

The substrate 610 includes, for example, a semiconductor substrate. The substrate 610 includes, for example, a semiconductor wafer (such as a silicon wafer) or a portion of a semiconductor wafer. In some embodiments, the substrate 610 is made of an elementary semiconductor material including silicon or germanium in a single crystal structure, a polycrystal structure, or an amorphous structure.

In some other embodiments, the substrate 610 is made of a compound semiconductor, such as silicon carbide, gallium arsenide, gallium phosphide, indium phosphide, indium arsenide, an alloy semiconductor, such as SiGe or GaAsP, or a combination thereof. The substrate 610 may also include multi-layer semiconductors, semiconductor on insulator (SOI) (such as silicon on insulator or germanium on insulator), or a combination thereof.

In some embodiments, the substrate 610 is a device wafer that includes various device elements. In some embodiments, the various device elements are formed in and/or over the substrate 610. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 610. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.

Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 610. The isolation features are used to surround active regions and electrically isolate various device elements formed in and/or over the substrate 610 in the active regions. In some embodiments, the isolation features include shallow trench isolation (STI) features, local oxidation of silicon (LOCOS) features, other suitable isolation features, or a combination thereof.

The isolation layer 620 is formed over the base portion 612, in accordance with some embodiments. The fin portion 614 is partially in the isolation layer 620, in accordance with some embodiments. The isolation layer 620 surrounds the fin portion 614, in accordance with some embodiments. The isolation layer 620 includes oxide (such as silicon oxide), in accordance with some embodiments. The isolation layer 620 is formed by a chemical vapor deposition (CVD) process and an etching back process, in accordance with some embodiments.

The gate stack G3 is formed over the fin portion 614, the nanostructures 616, and the isolation layer 620, in accordance with some embodiments. The gate stack G3 surrounds the nanostructures 601 and 616 and an upper portion of the fin portion 614, in accordance with some embodiments.

The gate stack G3 includes a gate electrode 602 and a gate dielectric layer 603, in accordance with some embodiments. The gate dielectric layer 603 is formed over the nanostructures 601 and 616, the fin portion 614, and the isolation layer 620, in accordance with some embodiments. The gate electrode 602 is formed over the gate dielectric layer 603, in accordance with some embodiments.

The gate electrode 602 is made of a semiconductor material (e.g. polysilicon) or a conductive material (e.g., metal or alloy), in accordance with some embodiments. The gate dielectric layer 603 is made of an insulating material, such as oxide (e.g., silicon oxide), in accordance with some embodiments.

The mask layers M1 and M2 are sequentially stacked over the gate stack G3, in accordance with some embodiments. In some embodiments, the mask layer M1 serves as a buffer layer or an adhesion layer that is formed between the underlying gate electrode 602 and the overlying mask layer M2. The mask layer M1 may also be used as an etch stop layer when the mask layer M2 is removed or etched, in accordance with some embodiments. The mask layers M1 and M2 are made of different materials, in accordance with some embodiments.

In some embodiments, the mask layer M1 is made of oxide, such as silicon oxide. In some embodiments, the mask layer M1 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the mask layer M2 is made of nitride (e.g., silicon nitride), oxynitride (e.g., silicon oxynitride), or another applicable material. In some embodiments, the mask layer M2 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After the deposition processes for forming the mask layers M1 and M2, the mask layers M1 and M2 are patterned by a photolithography process and an etching process, in accordance with some embodiments.

The spacer structure 201 is formed over sidewalls S2 of the gate stack G3, the nanostructures 616, and the isolation layer 620, in accordance with some embodiments. The inner layer 170 conformally covers the sidewalls S2 of the gate stack G3, the nanostructures 616, and a top surface 622 of the isolation layer 620, in accordance with some embodiments. The middle layer 190 conformally covers the inner layer 170, in accordance with some embodiments. The outer layer 210 covers the middle layer 190, in accordance with some embodiments.

The materials and the structures of the inner layer 170, the middle layer 190, and the outer layer 210 are similar to or the same as that of the inner layer 170, the middle layer 190, and the outer layer 210 of FIGS. 4A-1 and 4A-2, in accordance with some embodiments.

The inner spacer 630 is between the nanostructures 616 and between the nanostructures 601 and the source/drain structures 640, in accordance with some embodiments. The inner spacer 630 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof.

The source/drain structures 640 are in direct contact with the fin portion 614 and the nanostructures 616, in accordance with some embodiments. The source/drain structures 640 are positioned on two opposite sides of the gate stack G3, in accordance with some embodiments. The source/drain structures 640 include a source structure and a drain structure, in accordance with some embodiments.

The source/drain structures 640 are made of an N-type conductivity material, in accordance with some embodiments. The N-type conductivity material includes silicon phosphorus (SiP) or another suitable N-type conductivity material. The source/drain structures 640 are formed using an epitaxial process, in accordance with some embodiments.

The source/drain structures 640 are doped with the Group VA element, in accordance with some embodiments. The Group VA element includes phosphor (P), antimony (Sb), or another suitable Group VA material. In some embodiments, a concentration of the Group VA element (e.g. phosphor) ranges from about 3E21 atoms/cm$^3$ to about 7E21 atoms/cm$^3$. The source/drain structures 640 are also referred to as doped structures, in accordance with some embodiments.

In some other embodiments, the source/drain structures 640 are made of a P-type conductivity material, in accordance with some embodiments. The P-type conductivity material includes silicon germanium (SiGe) or another suitable P-type conductivity material. The source/drain structures 640 are formed using an epitaxial process, in accordance with some embodiments. The source/drain structures 640 are doped with the Group IIIA element, in accordance with some embodiments. The Group IIIA element includes boron or another suitable material.

Thereafter, as shown in FIGS. 7B-1 and 7B-2, an upper portion of the outer layer 210 above the source/drain structures 640 is removed, in accordance with some embodiments. In some embodiments, a lower portion 212 of the outer layer 210 remains between the source/drain structures 640 and the gate stack G3. The lower portion 212 has a top surface 212a, in accordance with some embodiments.

As shown in FIGS. 7B-1 and 7B-2, a recess 212r is formed in the top surface 212a of the lower portion 212, in accordance with some embodiments. The top surface 212a is lower than top surfaces 642 of the source/drain structures 640, in accordance with some embodiments. The removal process includes an isotropic etching process, such as a wet etching process, in accordance with some embodiments. In some embodiments, the outer layer 210 is made of silicon nitride, and the etchant used in the wet etching process includes phosphoric acid.

Afterwards, as shown in FIGS. 7C-1 and 7C-2, an upper portion of the middle layer 190 above the source/drain structures 640 is removed, in accordance with some embodiments. As shown in FIG. 7C-2, a lower portion 192 of the middle layer 190 remains between the outer layer 210 and the gate stack G3, in accordance with some embodiments.

The lower portion 192 has a top surface 192a, in accordance with some embodiments. The top surface 192a is lower than the top surface 642 of the source/drain structure 640, in accordance with some embodiments. As shown in FIG. 7C-2, a recess 192r is formed in the top surface 192a of the lower portion 192, in accordance with some embodiments.

The recess 212r in the top surface 212a of the outer layer 210 and the recess 192r in the top surface 192a of the middle layer 190 together form a recess R1, in accordance with some embodiments. The recess R1 has a W-like shape, in accordance with some embodiments. The depth D1 of the recess 212r ranges from about 1 nm to about 6 nm, in accordance with some embodiments. The depth D2 of the recess 192r ranges from about 1 nm to about 6 nm, in accordance with some embodiments.

The recess 212r has opposite edges 212E1 and 212E2, in accordance with some embodiments. The edge 212E1 is adjacent to the source/drain structure 640, in accordance with some embodiments. The edge 212E2 is adjacent to the middle layer 190, in accordance with some embodiments. The edge 212E1 is higher than the edge 212E2, in accordance with some embodiments.

The recess 192r has edges 192E1 and 192E2, in accordance with some embodiments. The edge 192E1 is adjacent to the gate stack G3, in accordance with some embodiments. The edge 192E2 is adjacent to the outer layer 210, in accordance with some embodiments. The edge 192E1 is higher than the edge 192E2, in accordance with some embodiments.

The lower portion 201a of the spacer structure 201 is thicker than an upper portion 201b of the spacer structure 201, in accordance with some embodiments. The thickness T201a of the lower portion 201a is greater than the thickness T201b of the upper portion 201b, in accordance with some embodiments. The spacer structure 201 has an L-like shape, in accordance with some embodiments.

Thereafter, as shown in FIGS. 7D-1 and 7D-2, an etch stop layer 230 is formed over the source/drain structure 640, the spacer structure 201, and the mask layer M2, in accordance with some embodiments. The etch stop layer 230 is filled into the recess 192r of the middle layer 190 and the recess 212r of the outer layer 210, in accordance with some embodiments.

The etch stop layer 230 is made of an insulating material, such as a nitrogen-containing material (e.g., silicon nitride), in accordance with some embodiments. The etch stop layer 230 is formed using a deposition process, such as a chemical vapor deposition (CVD) process, an atomic layer deposition (ALD) process, or a physical vapor deposition (PVD) process, in accordance with some embodiments.

Afterwards, as shown in FIGS. 7D-1 and 7D-2, a dielectric layer 240 is formed over the etch stop layer 230, in accordance with some embodiments. The dielectric layer 240 is made of any suitable insulating material, such as silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. The dielectric layer 240 is deposited by any suitable process, such as a CVD process, a spin-on process, a sputtering process, or a combination thereof, in accordance with some embodiments.

Thereafter, as shown in FIGS. 7E-1 and 7E-2, the steps of FIGS. 4E-1 to 4H-1 and 4E-2 to 4H-2 are performed to remove the mask layers M1 and M2, the upper portions of the dielectric layer 240, the etch stop layer 230, and the spacer structure 201, and the gate stack G3 and to form a gate stack G4, the contact structures 280, and the silicide layer SL, in accordance with some embodiments.

The gate stack G4 is wrapped around the nanostructures 616 and an upper part of the fin portion 614, in accordance with some embodiments. The gate stack G4 includes a gate dielectric layer 250, a work function metal layer 260, and a gate electrode layer 270, in accordance with some embodiments. The gate dielectric layer 250, the work function metal layer 260, and the gate electrode layer 270 are sequentially stacked over the nanostructures 616 and the upper portion of the fin portion 614, in accordance with some embodiments.

The gate dielectric layer 250 is made of a dielectric material, such as a high dielectric constant (high-k) material, in accordance with some embodiments. The high-k material is made of metal oxides, such as hafnium oxide ($HfO_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), aluminum oxide, hafnium dioxide-alumina ($HfO_2$—$Al_2O_3$) alloy, other suitable high-k dielectric materials, or combinations thereof, in accordance with some embodiments. In some other embodiments, the high-k material is made of metal nitrides, metal silicates, transition metal-oxides, transition metal-nitrides, transition metal-silicates, oxynitrides of metals, other suitable materials, or combinations thereof.

The work function metal layer 260 provides a desired work function for transistors to enhance device performance including improved threshold voltage. In the embodiments of forming an NMOS transistor, the work function metal layer 260 can be an n-type metal capable of providing a work function value suitable for the device, such as equal to or less than about 4.5 eV. The n-type metal may be made of metal, metal carbide, metal nitride, or a combination thereof. For example, the n-type metal is made of tantalum, tantalum nitride, or a combination thereof.

In the embodiments of forming a PMOS transistor, the work function metal layer 260 can be a p-type metal capable of providing a work function value suitable for the device, such as equal to or greater than about 4.8 eV. The p-type metal may be made of metal, metal carbide, metal nitride, other suitable materials, or a combination thereof. For example, the p-type metal is made of titanium, titanium nitride, other suitable materials, or a combination thereof.

The gate electrode layer 270 is made of a suitable metal material, such as aluminum, tungsten, gold, platinum, cobalt, another suitable metal, an alloy thereof, or a combination thereof, in accordance with some embodiments.

The contact structures 280 are formed in the dielectric layer 240 and the etch stop layer 230, in accordance with some embodiments. The silicide layer SL is formed between the contact structures 280 and the source/drain structures 640, in accordance with some embodiments. In this step, a semiconductor device structure 600 is substantially formed, in accordance with some embodiments.

Figure 8B:
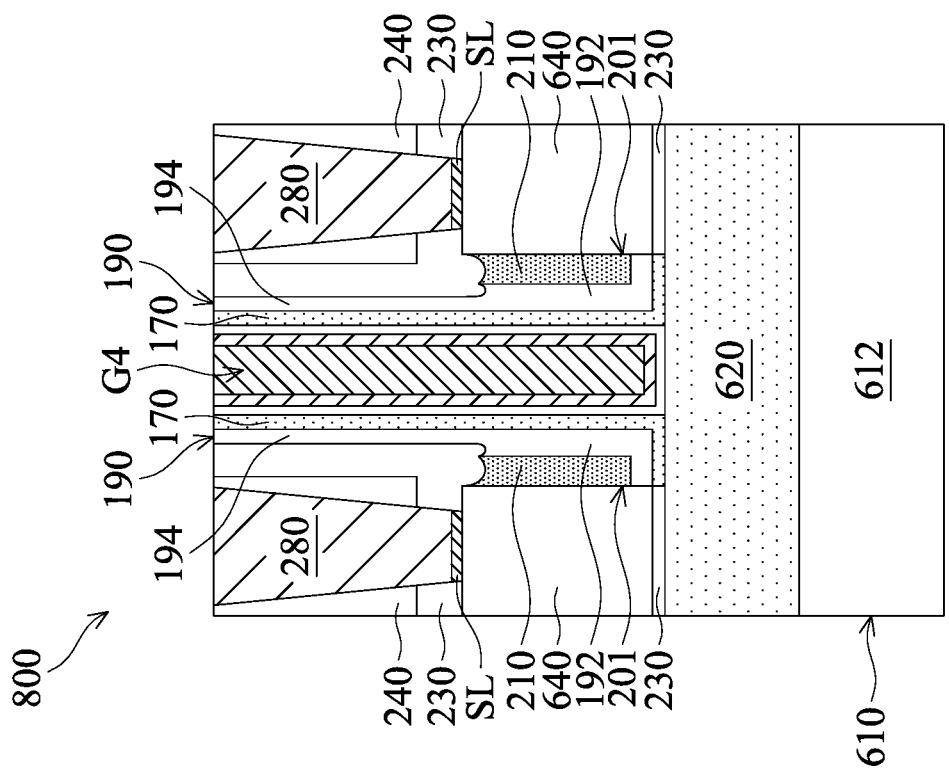
FIG. 8B is a cross-sectional view of a semiconductor device structure, in accordance with some embodiments.
Figure 8A:
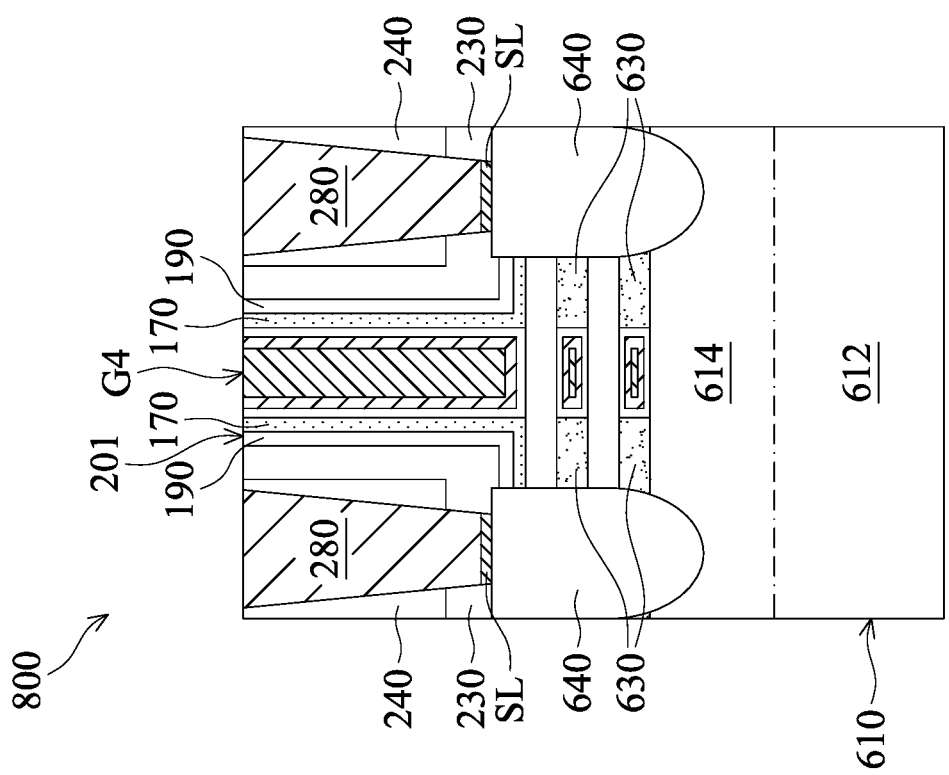
FIG. 8A is a cross-sectional view of a semiconductor device structure, in accordance with some embodiments.

FIG. 8A is a cross-sectional view of a semiconductor device structure 800, in accordance with some embodiments. FIG. 8B is a cross-sectional view of a semiconductor device structure 800, in accordance with some embodiments.

As shown in FIGS. 8A and 8B, the semiconductor device structure 800 is similar to the semiconductor device structure 600 of FIGS. 7E-1 and 7E-2, except that the middle layer 190 further has an upper portion 194, in accordance with some embodiments. The upper portion 194 is thinner than the lower portion 192 of the middle layer 190, in accordance with some embodiments.

Processes and materials for forming the semiconductor device structures 500, 600, and 800 may be similar to, or the same as, those for forming the semiconductor device structure 400 described above. Elements designated by the same or similar reference numbers as those in FIGS. 1 to 8B have the same or similar structures and the materials. Therefore, the detailed descriptions thereof will not be repeated herein.

In accordance with some embodiments, semiconductor device structures and methods for forming the same are provided. The methods (for forming the semiconductor device structure) remove an upper portion of a spacer structure to enlarge the space for accommodating a contact structure. A lower portion of the spacer structure remains to separate a gate stack from source/drain structures.

In accordance with some embodiments, a method for forming a semiconductor device structure is provided. The method includes forming a gate stack over a substrate. The method includes forming a spacer structure over a sidewall of the gate stack. The spacer structure has an inner layer, a middle layer, and an outer layer, the inner layer covers the sidewall of the gate stack, and the middle layer is between the inner layer and the outer layer. The method includes forming a source/drain structure in and over the substrate, wherein a portion of the spacer structure is between the source/drain structure and the gate stack. The method includes partially removing the outer layer, wherein a first lower portion of the outer layer remains between the source/drain structure and the gate stack. The method includes partially removing the middle layer, wherein a second lower portion of the middle layer remains between the source/drain structure and the gate stack.

In accordance with some embodiments, a method for forming a semiconductor device structure is provided. The method includes forming a gate stack over a substrate. The method includes forming a spacer structure over a sidewall of the gate stack. The spacer structure has an inner layer, a middle layer, and an outer layer, the inner layer conformally covers the sidewall of the gate stack, the middle layer covers the inner layer, and the outer layer covers the middle layer. The method includes forming a source/drain structure in and over the substrate. The method includes removing a first upper portion of the outer layer above the source/drain structure. The method includes removing a second upper portion of the middle layer above the source/drain structure.

In accordance with some embodiments, a semiconductor device structure is provided. The semiconductor device structure includes a substrate. The semiconductor device structure includes a gate stack over the substrate. The semiconductor device structure includes a spacer structure over a sidewall of the gate stack. The spacer structure has an inner layer, a middle layer, and an outer layer, the inner layer covers the sidewall of the gate stack, and the middle layer is between the inner layer and the outer layer. The semiconductor device structure includes a source/drain structure in and over the substrate, wherein a portion of the spacer structure is between the source/drain structure and the gate stack, and a first top surface of the middle layer is lower than a second top surface of the source/drain structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a gate stack over a substrate;
   forming a spacer structure over a sidewall of the gate stack, wherein the spacer structure has an inner layer, a middle layer, and an outer layer, the inner layer covers the sidewall of the gate stack, and the middle layer is between the inner layer and the outer layer;
   forming a source/drain structure in and over the substrate, wherein a portion of the spacer structure is between the source/drain structure and the gate stack;
   partially removing the outer layer, wherein a first lower portion of the outer layer remains between the source/drain structure and the gate stack, and a first recess is formed in the outer layer after the partially removing of the outer layer; and
   partially removing the middle layer, wherein a second lower portion of the middle layer remains between the source/drain structure and the gate stack.

2. The method for forming the semiconductor device structure as claimed in claim 1, wherein the forming of the spacer structure comprises:
   depositing an inner material layer over the gate stack and the substrate;
   depositing a middle material layer over the inner material layer;
   depositing an outer material layer over the middle material layer; and
   partially removing the outer material layer, the middle material layer, and the inner material layer over a first top surface of the gate stack and a second top surface of the substrate.

3. The method for forming the semiconductor device structure as claimed in claim 2, further comprising:
   performing a doping process over the substrate to form a doped region in the substrate after depositing the inner material layer and before depositing the middle material layer.

4. The method for forming the semiconductor device structure as claimed in claim 1, wherein the outer layer and the middle layer are made of different materials.

5. The method for forming the semiconductor device structure as claimed in claim 1, wherein the inner layer and the middle layer are made of different materials.

6. The method for forming the semiconductor device structure as claimed in claim 1, wherein a second recess is formed in the middle layer after the partially removing of the middle layer.

7. The method for forming the semiconductor device structure as claimed in claim 6, wherein the first recess of the outer layer and the second recess of the middle layer together form a recess having a W-like shape in a cross-sectional view of the outer layer and the middle layer.

8. The method for forming the semiconductor device structure as claimed in claim 7, wherein the first recess has a first edge and a second edge, the first edge is adjacent to the source/drain structure, the second edge is adjacent to the middle layer, and the first edge is higher than the second edge.

9. The method for forming the semiconductor device structure as claimed in claim 8, wherein the second recess has a third edge and a fourth edge, the third edge is adjacent to the gate stack, the fourth edge is adjacent to the outer layer, and the third edge is higher than the fourth edge.

10. A method for forming a semiconductor device structure, comprising:
    forming a gate stack over a substrate;
    forming a spacer structure over a sidewall of the gate stack, wherein the spacer structure has an inner layer, a middle layer, and an outer layer, the inner layer conformally covers the sidewall of the gate stack, the middle layer covers the inner layer, and the outer layer covers the middle layer;
    forming a source/drain structure in and over the substrate;
    removing a first upper portion of the outer layer above the source/drain structure, wherein a first top surface of the outer layer is lower than a second top surface of the source/drain structure after the first upper portion of the outer layer is removed; and
    removing a second upper portion of the middle layer above the source/drain structure.

11. The method for forming the semiconductor device structure as claimed in claim 10, wherein the middle layer conformally covers the inner layer, and the outer layer conformally covers the middle layer.

12. The method for forming the semiconductor device structure as claimed in claim 10, wherein the substrate has a base portion and a fin portion over the base portion, and the gate stack is wrapped around the fin portion.

13. The method for forming the semiconductor device structure as claimed in claim 12, further comprising:
    forming a nanostructure over the fin portion, wherein the gate stack is wrapped around the nanostructure.

14. The method for forming the semiconductor device structure as claimed in claim 10, wherein a lower portion of the spacer structure is thicker than a third upper portion of the spacer structure after removing the second upper portion of the middle layer above the source/drain structure.

15. A method for forming a semiconductor device structure, comprising:
    forming a gate stack over a substrate;
    forming a spacer structure over a first sidewall of the gate stack, wherein the spacer structure has an inner layer, a middle layer, and an outer layer, the inner layer covers the first sidewall of the gate stack, the middle layer covers a second sidewall of the inner layer, and the outer layer covers a third sidewall of the middle layer;
    forming a source/drain structure in and over the substrate;
    removing a first portion of the outer layer to expose a first upper portion of the third sidewall of the middle layer; and
    removing a second portion of the middle layer to expose a second upper portion of the second sidewall of the inner layer, wherein a first top surface of the middle layer is lower than a second top surface of the source/drain structure after the second portion of the middle layer is removed.

16. The method for forming the semiconductor device structure as claimed in claim 15, wherein the first top surface of the middle layer is a concave top surface.

17. The method for forming the semiconductor device structure as claimed in claim 15, wherein a third top surface of the outer layer is lower than the second top surface of the source/drain structure after the first portion of the outer layer is removed.

18. The method for forming the semiconductor device structure as claimed in claim 17, wherein the third top surface of the outer layer is a concave top surface.

19. The method for forming the semiconductor device structure as claimed in claim 10, wherein the first top surface of the outer layer is a concave surface.

20. The method for forming the semiconductor device structure as claimed in claim 19, wherein the first top surface has a first portion and a second portion, the first portion is between the second portion and the source/drain structure, and the first portion is higher than the second portion.

* * * * *